(12) United States Patent
Chen et al.

(10) Patent No.: US 12,417,959 B2
(45) Date of Patent: Sep. 16, 2025

(54) INTEGRATED CIRCUIT DEVICE COOLING USING THERMORESPONSIVE MATERIALS

(71) Applicant: Intel Corporation, Santa Clara, CA (US)

(72) Inventors: Tsung-Yu Chen, Taoyuan (TW); Rebecca Shia, Taipei (TW)

(73) Assignee: Intel Corporation, Santa Clara, CA (US)

( * ) Notice: Subject to any disclaimer, the term of this patent is extended or adjusted under 35 U.S.C. 154(b) by 709 days.

(21) Appl. No.: 17/668,241

(22) Filed: Feb. 9, 2022

(65) Prior Publication Data
US 2023/0253287 A1 Aug. 10, 2023

(51) Int. Cl.
| | |
|---|---|
| *H01L 23/373* | (2006.01) |
| *H01L 21/48* | (2006.01) |
| *H01L 23/522* | (2006.01) |
| *H01L 23/528* | (2006.01) |

(52) U.S. Cl.
CPC ...... *H01L 23/3731* (2013.01); *H01L 21/4807* (2013.01); *H01L 23/5226* (2013.01); *H01L 23/5283* (2013.01)

(58) Field of Classification Search
CPC ............ H01L 23/3731; H01L 23/5226; H01L 23/5283; H01L 21/4807

USPC ......................................................... 257/705
See application file for complete search history.

(56) References Cited

U.S. PATENT DOCUMENTS 10,524,392 B1    12/2019   Chen
2021/0036096 A1*  2/2021   Li ...................... H01L 23/5226

OTHER PUBLICATIONS

Karimineghlani, P., et al., "A Temperature-responsive poly(vinyl alcohol) gel for controlling fluidity of an inorganic phase change material", Journal of Materials Chemisty A; Royal Society of Chemistry, 2017, 9 pages.

* cited by examiner

*Primary Examiner* — Tu-Tu V Ho
(74) *Attorney, Agent, or Firm* — Essential Patents Group, LLP

(57) ABSTRACT

Integrated circuit dies, systems, and techniques, are described herein related to efficient heat dissipation in integrated circuit implementations, such as three-dimensional packages, using integrated thermoresponsive materials. An integrated circuit die includes a thermoresponsive material in a via that extends through at least a portion of a device layer and one or more metal interconnect layers of the integrated circuit die. Such integrated circuit dies including thermoresponsive materials may be stacked vertically with their thermoresponsive material filled vias aligned.

21 Claims, 12 Drawing Sheets

INTEGRATED CIRCUIT DEVICE COOLING USING THERMORESPONSIVE MATERIALS

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed.

Traditional packaging for monolithic chips transfers heat from the top surfaces of integrated circuit dies with thermal interface materials and integrated heat spreaders. The development of multiple chiplets and stacking of dies within single packages is the new direction. This leads to new challenges to dissipate heat generated in the stacked dies. As power densities and power envelopes increase to reach peak performance, previous methods are becoming ineffective in removing sufficient amounts of heat.

Thus, new methods of, and materials for, heat dissipation are needed to remove heat from the integrated circuit devices in integrated circuit packaging.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1A:
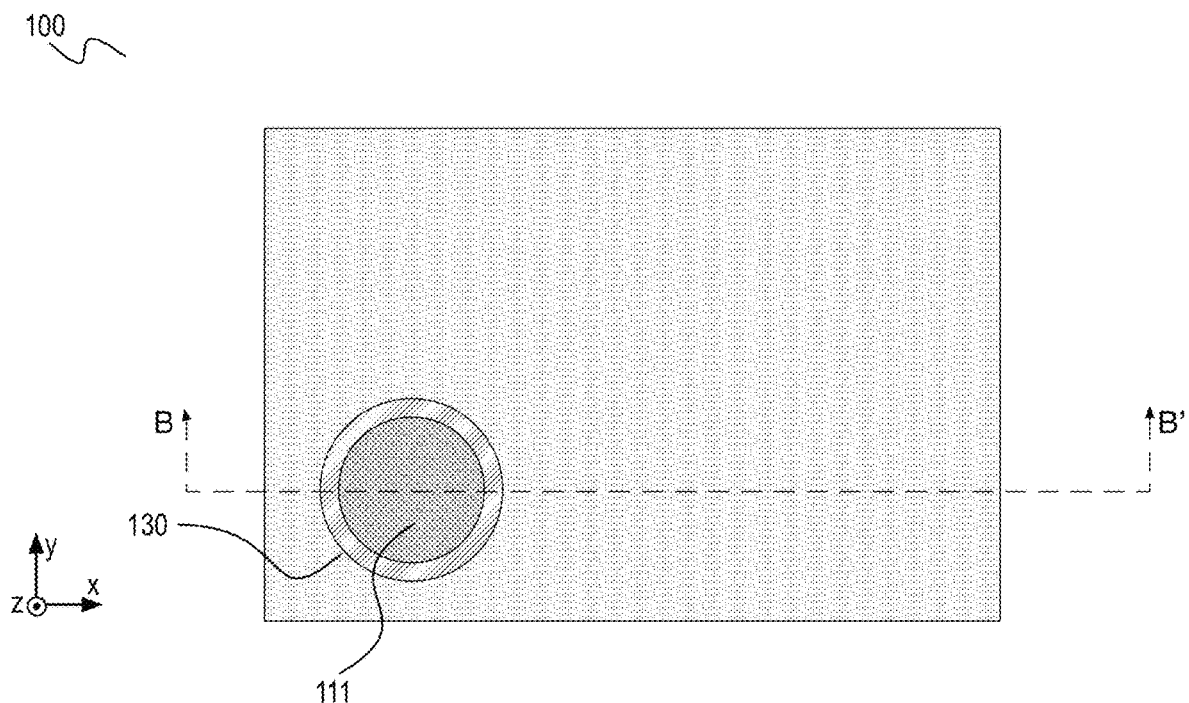
FIG. 1A illustrates a cross-sectional top view.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and metallized vias in integrated circuit packages and dies. The term "solder pad" may be occasionally substituted for "bond pad" and carries the same meaning.

Here, the term "via" generally refers to a hole through one or more layers of a die, substrate, board, etc. Such vias may be filled with any suitable material.

Here, the term "solder bump" generally refers to a solder layer formed on a bond pad. The solder layer typically has a round shape, hence the term "solder bump."

Here, the term "substrate" generally refers to a planar platform including dielectric and metallization structures. The substrate mechanically supports and electrically couples one or more integrated circuit dies on a single platform, with encapsulation of the one or more integrated circuit dies by a moldable dielectric material. The substrate may be an interposer. The substrate generally includes solder bumps as bonding interconnects on both sides. One side of the substrate, generally referred to as the "die side," includes solder bumps for chip or die bonding. The opposite side of the substrate, generally referred to as the "land side," includes solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, thermal, magnetic, or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top," "bottom," "above," and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Embodiments of the present description relate to the use of thermoresponsive materials and related structures to improve heat transfer away from sensitive portions of integrated circuit dies. These materials and structures can help in the thermal management of integrated circuit dies by providing thermal reservoirs within dies as well as thermal paths off die. The strategic use of thermoresponsive materials can enhance both the capacity of thermal reservoirs and the efficiency of the heat transfer away from sensitive portions of integrated circuit dies. In some embodiments, an integrated circuit die includes a thermoresponsive material in a via that extends from a surface through at least a device layer and one or more metal interconnect layers. In some embodiments, a system includes adjacent integrated circuit dies stacked vertically with vias aligned, coupled, and each holding a thermoresponsive material. In some embodiments, a method includes forming a hole in an integrated circuit die, optionally forming a containment layer on the surface(s) of the hole, and providing the thermoresponsive material into the hole.

Figure 1B:
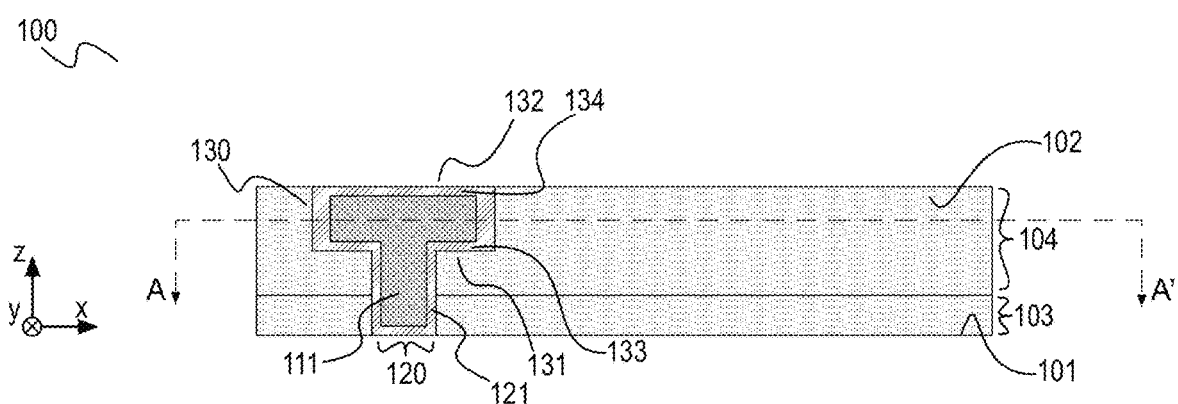
FIG. 1B illustrates a cross-sectional side view, of an example integrated circuit die, including a via and a trench, both holding a thermoresponsive material.

FIG. 1A illustrates a cross-sectional top view, and FIG. 1B illustrates a cross-sectional side view, of an example integrated circuit die 100, including a via 120 and a trench 130, both holding a thermoresponsive material 111, arranged in accordance with at least some implementations of the present disclosure. For example, FIG. 1B provides a cross sectional view at B-B' as shown in FIG. 1A, and FIG. 1A provides a cross sectional view at A-A' as shown in FIG. 1B. As shown in FIG. 1A, cylindrical trench 130 contains thermoresponsive material 111. FIG. 1B shows trench 130 extending from an upper surface 132, which forms part of and is substantially planar with upper surface 102 of integrated circuit die 100. Upper surface 132 is on a top layer 134 of trench 130. FIG. 1B shows a hole, via 120, extending vertically through integrated circuit die 100, up from a lower surface 101, through a device layer 103 and one or more of a larger number of metallization layers 104. Device layer 103 may include any suitable devices such as transistors, resistors, capacitors, inductors, etc. Trench 130 extends into integrated circuit die 100 from an upper surface 102 through some of metallization layers 104. Via 120 connects to trench 130 at an opening in a lower surface 131 of a bottom layer 133 of trench 130. Via 120 is in fluid communication with trench 130, and thermoresponsive material 111 is free to flow between the structures. Devices of device layer 103, inclusive of those adjacent via 120, are the heat-generating structures of integrated circuit die 100, e.g., the one or more devices in device layer 103 and the potential current-carrying conductors in metallization layers 104. In the example shown, via 120 is lined with an optional via layer 121.

Both trench 130 and via 120 are configured to hold thermoresponsive materials 111 and to absorb and channel thermal energy away from the heat-generating and sensitive areas of integrated circuit die 100, e.g., device layer 103. As used herein, the term "thermoresponsive material" indicates a material that exhibits a drastic or discontinuous change of its physical properties with temperature. In some embodiments, the thermoresponsive material is a thermoresponsive polymer. The thermoresponsive material may be characterized as a temperature responsive material, a phase change material or polymer, or the like. Thermoresponsive material 111 within both structures act as heat sinks for the heat-generating portions of integrated circuit die 100 as trench 130 and via 120 have relatively large heat capacities for storing heat generated elsewhere. Heat is transferred laterally from the heat-generating portions of integrated circuit die 100 through the bulk of integrated circuit die 100 and through thermally conductive channels, e.g., metallization meant for current conduction, to thermoresponsive materials 111 in via 120 and trench 130. As will be discussed in further detail herein, heat can then be transferred off of integrated circuit die 100 through similar structures on other integrated circuit dies 100 in a stack of integrated circuit dies 100 or into another heat dissipation device such as heat spreader structures. In this way, as thermoresponsive materials 111 within via 120 and trench 130 shed heat off integrated circuit die 100, they can be maintained at a temperature lower than the heat-generating portions of integrated circuit die 100 and so can continue to act as a heat sink for the warmer portions of integrated circuit die 100.

Particular thermoresponsive materials 111 can be chosen to fill trench 130 and via 120 to enhance the cooling of sensitive portions of integrated circuit die 100. Thermoresponsive materials 111 with high heat capacities can be used to store relatively high amounts of thermal energies in via 120 and trench 130, portions of integrated circuit die 100 that are less sensitive and that are away from the heat generation portions. One way to achieve these desired high heat capacities is to use thermoresponsive materials 111 that utilize the latent heat capacities that accompany phase changes. At the phase-change temperature, these materials can store relatively large amounts of thermal energy without a corresponding increase in temperature. Thermoresponsive materials 111 can be chosen with phase-change temperatures in the desired range of operation for the integrated circuit die 100. In some embodiments, thermoresponsive material 111 may be characterized as a phase-change polymer or phase change material. In some embodiments, thermoresponsive material 111 includes inorganic hydrated salts. In some embodiments, lithium nitrate trihydrate is used. Lithium nitrate trihydrate has a relatively large latent heat of fusion and at a melting temperature useful for many applications.

In addition or in the alternative, thermoresponsive materials 111 with sufficiently low viscosities can be chosen to enhance cooling by way of convection. Thermoresponsive materials 111 that become less resistant to flow, i.e., less viscous and more fluid, as they absorb heat can be used to increase heat dissipation away from sensitive portions of integrated circuit die 100. Thermoresponsive polymer gels can have reduced viscosities as they absorb thermal energy, which can allow for improved cooling through convection. In some embodiments, a mixture of lithium nitrate trihydrate and poly(vinyl alcohol) is used.

Via 120 can act as a reservoir for thermoresponsive materials 111 and for the thermal energy stored there, as well as a path for thermal energy to efficiently dissipate off of integrated circuit die 100. Heat can be transferred into the thermoresponsive material 111 within via 120 from integrated circuit die 100, but also into it from (and out of it to) other integrated circuit dies 100 with vias 120 thermally coupled to it. This heat transfer from and to other integrated circuit dies 100 thermally coupled by thermoresponsive materials 111 in vias 120 can include heat transfer by convection through thermoresponsive materials 111 as well as by conduction. In some embodiments, vias 120 are 100 nm wide. Vias 120 can be made smaller as required, e.g., for space limitations. In some embodiments, vias 120 are 1000 nm wide. Vias 120 can be made wider as necessary to meet heat storage and transfer requirements.

In some embodiments, via 120 is lined with via layer 121. In some embodiments, a thermally conductive material is chosen for via layer 121 to enhance heat transfer from the heat-generating areas of integrated circuit die 100 into via 120 and thermoresponsive material 111. For example, via layer 121 may be provided on inner sidewalls of integrated circuit die 100 within via 120 such that via layer 121 covers such sidewalls. Such thermally conductive materials can also improve heat transfer vertically out of and away from the heat-generating integrated circuit die 100. Heat can be transferred through thermally conductive materials in via 120 up to trench 130, or vertically to structures thermally coupled to via 120, for example, a heat spreader (not shown) or to other dies with mated vias 120. In some embodiments, via layer 121 is a metal such as copper or aluminum. In some embodiments, electrical conductors are electrically connected to via layer 121.

Trench 130 can act as a relatively large reservoir for thermoresponsive materials 111 and for the thermal energy stored there. Trench 130 can generally be made wider, sometimes much wider, than via 120 and so can be made to hold more thermoresponsive materials 111 and more thermal energy.

Heat can be transferred into thermoresponsive material 111 within trench 130 from thermoresponsive material 111 within via 120 and otherwise from integrated circuit die 100, but also into it from (and out of it to) other integrated circuit dies 100 with vias 120 (or other structures) thermally coupled to it. Trench 130 can also act as a path for thermal energy to efficiently dissipate off of integrated circuit die 100. The larger width of trench 130 can enhance heat spreading away from heat-generating and sensitive areas of the integrated circuit die 100. Trench 130 can be sized (and shaped) to best couple thermal energy to matching structures on other integrated circuit dies 100 or, e.g., heat spreaders. This heat transfer from and to other thermally coupled integrated circuit dies 100 can include heat transfer by convection through thermoresponsive materials 111 as well as by conduction.

Trench 130 can be lined with a thermally conductive material to enhance heat transfer from the heat-generating areas of integrated circuit die 100 and from via 120 and its thermoresponsive materials 111. Such thermally conductive materials can also improve heat transfer vertically out of and away from the heat-generating integrated circuit die 100. Heat can be transferred through thermally conductive materials in via 120 up to trench 130, and vertically to thermally coupled structures, for example, a heat spreader (not shown) or to other dies with, e.g., mated vias 120. In some embodiments, trench 130 is lined with metal such as copper. In some embodiments, trench 130 is lined with aluminum.

Figure 2A:
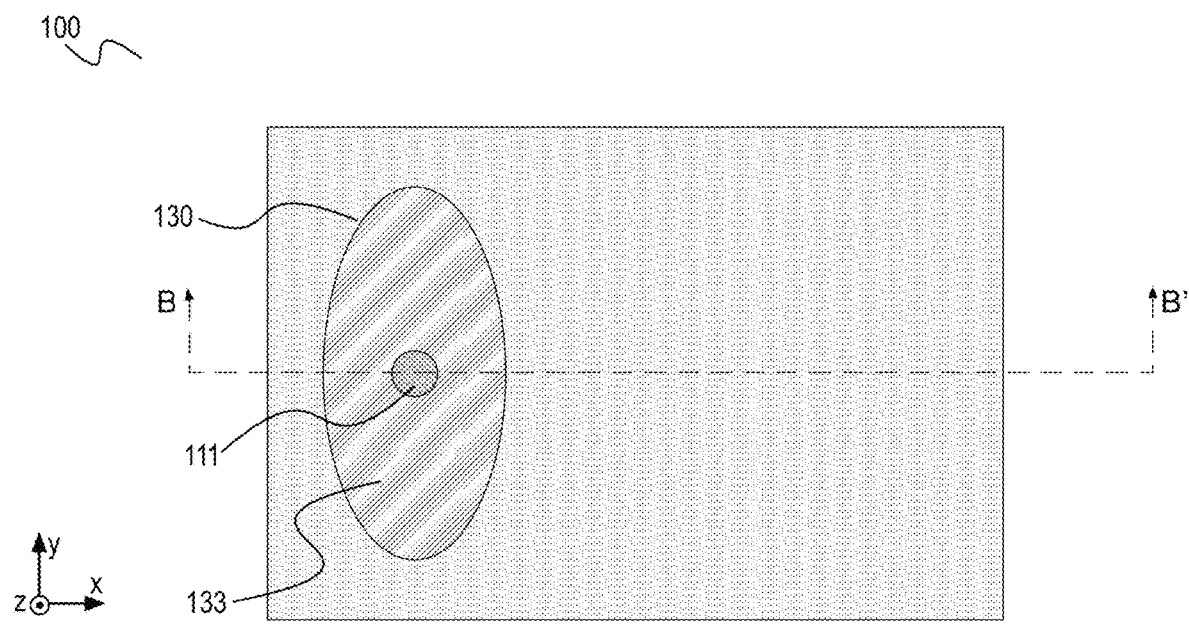
FIG. 2A illustrates a cross-sectional top view.
Figure 2B:
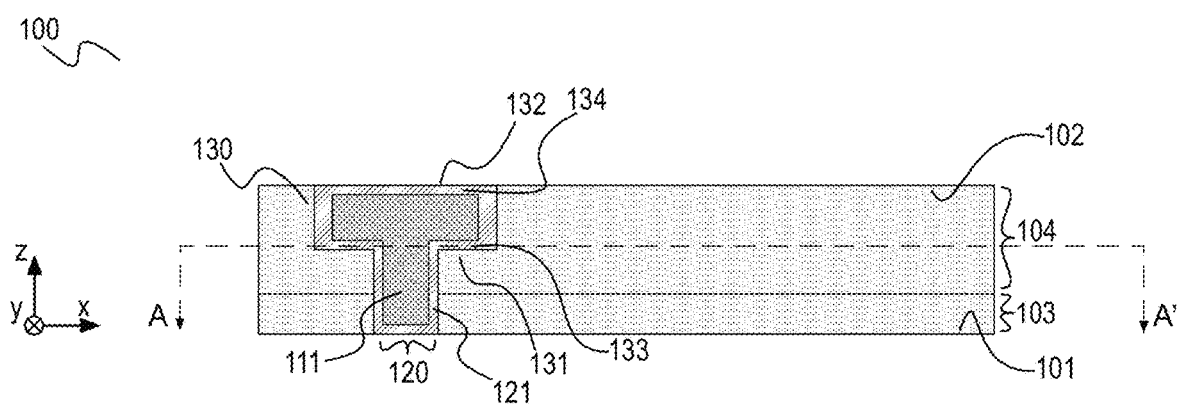
FIG. 2B illustrates a cross-sectional side view of an example integrated circuit die, including a via and a larger trench, both holding thermoresponsive material.

FIG. 2A illustrates a cross-sectional top view, and FIG. 2B illustrates a cross-sectional side view of an example integrated circuit die 100, including via 120 and larger trench 130, both holding thermoresponsive material 111, arranged in accordance with at least some implementations of the present disclosure. For example, FIG. 2B provides a cross sectional view at B-B' as shown in FIG. 2A, and FIG. 2A provides a cross sectional view at A-A' as shown in FIG. 2B. The example in FIG. 2 shows trench 130 with a same width in the x direction as the example in FIG. 1, but with a longer length in the y direction. The larger dimensions of trench 130 correspond to larger heat transfer and heat storage capabilities. FIG. 2A shows from above an opening in bottom layer 133 of trench 130. Thermoresponsive material 111 can be seen in the opening, which is where trench 130 and via 120 meet. As shown in FIG. 2B, trench 130 extends from its top layer 134 and upper surface 132, which forms part of and is substantially planar with upper surface 102 of integrated circuit die 100, through some of metallization layers 104. Via 120 extends vertically through integrated circuit die 100, up from lower surface 101, through device layer 103 and one or more of a larger number of metallization layers 104. Via 120 connects to trench 130 at lower surface 131, in this case at an opening in lower surface 131. Via 120 is in fluid communication with trench 130, and thermoresponsive material 111 is free to flow between the structures. In the example shown, via 120 is lined with optional via layer 121.

As discussed previously, the potentially larger lateral dimensions of trench 130 allow for the containment of larger volumes of thermoresponsive material 111. Trench 130 can be sized larger, if necessary, and as available space allows, to account for increased heat transfer and storage requirements. Trenches 130 with larger dimensions, especially if multiple dimensions can be increased, result in dramatically increased heat capacities. With properly selected thermoresponsive materials 111 and because of the nature of latent heat storage and the absence of a rise in temperature for heat transfer at the melting point, a larger trench 130 can increase thermal storage and allow for improved heat transfer into the heat sink of trench 130 from the hotter heat-generating areas of the integrated circuit die 100. In some embodiments, the top two metallization layers 104 are used for forming trench 130. In some embodiments, the top three metallization layers 104 are used for forming trench 130. More layers can be used as necessary. Larger (and especially longer and deeper) trenches 130 can better enable heat transfer into the trenches 130 from within the same integrated circuit die 100. In some embodiments, trenches 130 run the length or width of integrated circuit die 100. In some embodiments, trenches 130 run almost the length or width of integrated circuit die 100 less only a small keep-out dimension on either end of the length of trench 130. In some embodiments, trench 130 is the length of five diameters of via 120.

As previously discussed, trench 130 can be fashioned to maximize thermal coupling by matching the size and shape of corresponding structures to be connected to integrated circuit die 100 at trench 130, e.g., heat spreaders or other integrated circuit dies 100. A larger length and/or width of trench 130 enables greater heat flux out of trench 130 through the expanded area of upper surface 132. More heat can be dissipated out of and through trench 130 as the contact area of upper surface 132 is increased. In some embodiments, trench 130 is half again as wide as via 120. In some embodiments, trench 130 is 10 times wider than via 120. In some embodiments, trench 130 can be made wider to compensate for its shallowness or to maximize thermal coupling upwards. In some embodiments, trench 130 is 20 times wider than via 120. In some embodiments, trench 130 is 40 times wider than via 120. In some embodiments, trench 130 is three times longer than its width. In some embodiments, trench 130 is many times longer than its width, running the length or width of integrated circuit die 100.

Figure 3A:
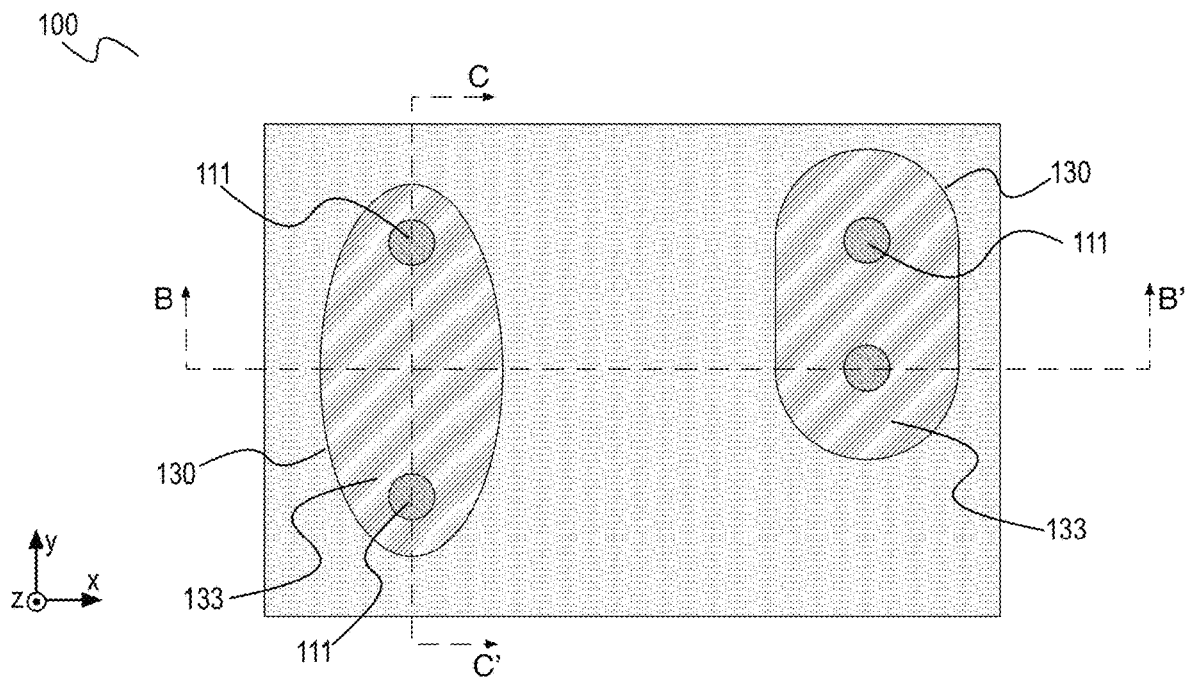
FIG. 3A illustrates a cross-sectional top view.
Figure 3B:
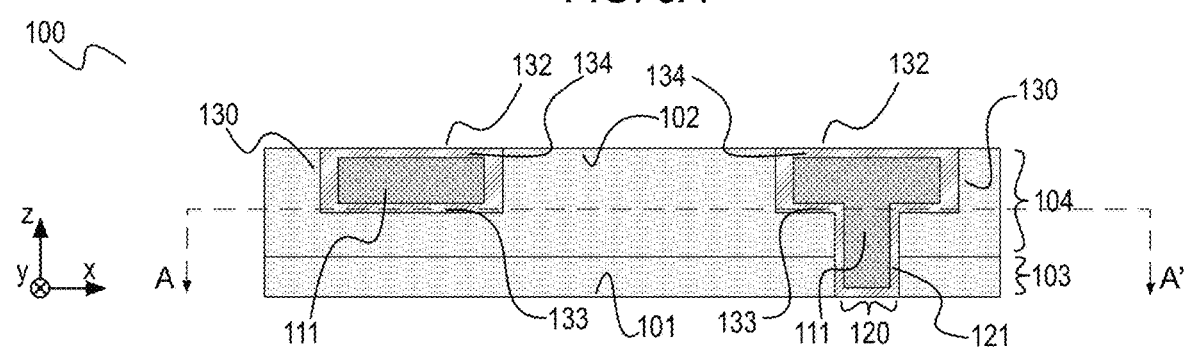
FIGS. 3B and 3C illustrate cross-sectional side views of an example integrated circuit die, including vias and trenches holding thermoresponsive material.
Figure 3C:
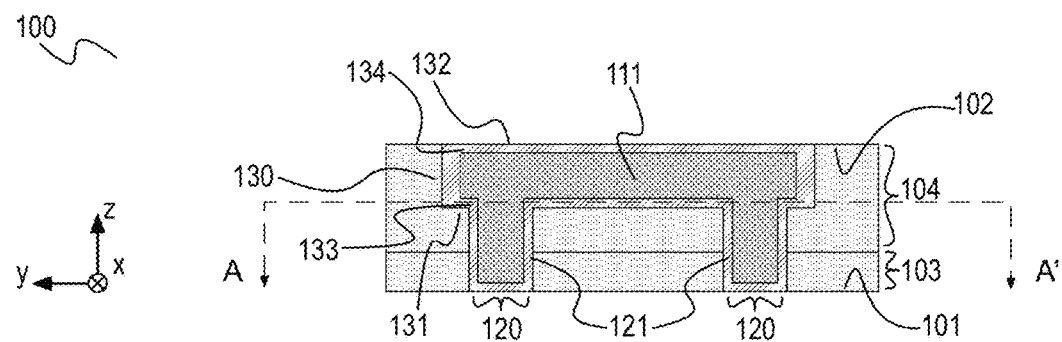

FIG. 3A illustrates a cross-sectional top view, and FIGS. 3B and 3C illustrate cross-sectional side views of an example integrated circuit die 100, including vias 120 and trenches 130 holding thermoresponsive material 111, arranged in accordance with at least some implementations of the present disclosure. For example, FIG. 3B provides a cross sectional view at B-B' as shown in FIG. 3A, FIG. 3C provides a cross sectional view at C-C' as shown in FIG. 3A, and FIG. 3A provides a cross sectional view at A-A' as shown in FIGS. 3B and 3C. The example in FIG. 3 shows left trench 130 with the same width and length as the example in FIG. 2, but with an additional via 120, and smaller right trench 130 with two vias 120. FIG. 3A shows openings in bottom layer 133 of trenches 130. Thermoresponsive material 111 can be seen in the openings, which are where trenches 130 meet vias 120. Vias 120 are in fluid communication with their respective trenches 130, and thermoresponsive material 111 is free to flow between the structures. Added vias 120 and trenches 130 provide more heat transfer and heat storage capabilities, including added capacity for transferring heat up through integrated circuit die 100, for example, from another integrated circuit die 100 below and up to either yet another integrated circuit die 100 or, e.g., a heat spreader. As shown in FIG. 3B, trenches 130 extend from upper surface 132 of top layer 134, which forms part of and is substantially planar with upper surface 102 of integrated circuit die 100. Trenches 130 extend into integrated circuit die 100 through some of metallization layers 104. Via 120 extends vertically through integrated circuit die 100, up from lower surface 101, through device layer 103 and one or more of a larger number of metallization layers 104. Via 120 is lined with optional via layer 121 and connects to right trench 130 at one of the openings in lower surface 131 of bottom layer 133. Via 120 and trenches 130 hold thermoresponsive material 111. As seen in FIG. 3C, vias 120 extend vertically through integrated circuit die 100, up from lower surface 101, through device layer 103 and one or more of a larger number of metallization layers 104. Vias 120 connect to left trench 130 at openings in lower surface 131 of bottom layer 133. In the example shown, vias 120 are lined with optional via layers 121. The longer length of trench 130 in the y direction can be seen in FIG. 3C, as can the second via 120. As discussed regarding the example in FIG. 2, the larger trenches 130 (relative to trench 130 shown in the example of FIG. 1) corresponds to enhanced thermal storage and transfer capabilities.

Additionally, additional vias 120 provide increased thermal storage and transfer capabilities as well. Beyond the added storage volume for holding thermoresponsive materials 111, any additional vias 120 and trenches 130 provide added paths for thermal energy up through integrated circuit die 100. These paths can provide for heat transfer up from a thermally coupled integrated circuit die 100 below and up to other thermally coupled structures above, for example, yet another integrated circuit die 100 or, e.g., a heat spreader positioned above one or both trenches 130. Such added vias 120 and trenches 130 can enable enhanced heat flux up through integrated circuit die 100 and therefore, as with previously discussed structures, allow for the stacking of heat-generating integrated circuit dies 100 and heat transfer up to heat spreaders and other heat sinks to better cool the entire stack. The embodiment in FIG. 3 shows two vias 120 coupled to each trench 130, but any number of vias 120 may be coupled to one or multiple trenches 130. In some embodiments, three to five vias 120 are coupled to trench 130. In some embodiments, five to eight vias 120 are couple to trench 130. In some embodiments, four trenches 130 are coupled to three vias 120 each. More trenches 130 can be used if needed.

Figure 4A:
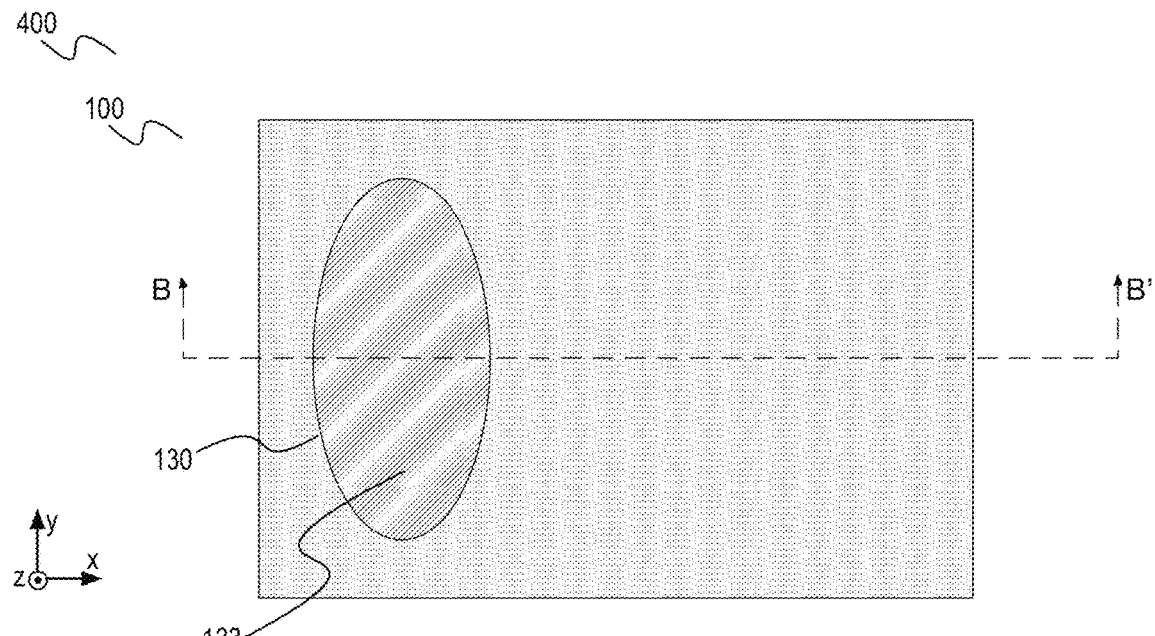
FIG. 4A illustrates a cross-sectional top view and FIG. 4B illustrates a cross-sectional side view of an example system of stacked and thermally coupled integrated circuit dies, including vias and trenches holding thermoresponsive materials.
Figure 4B:
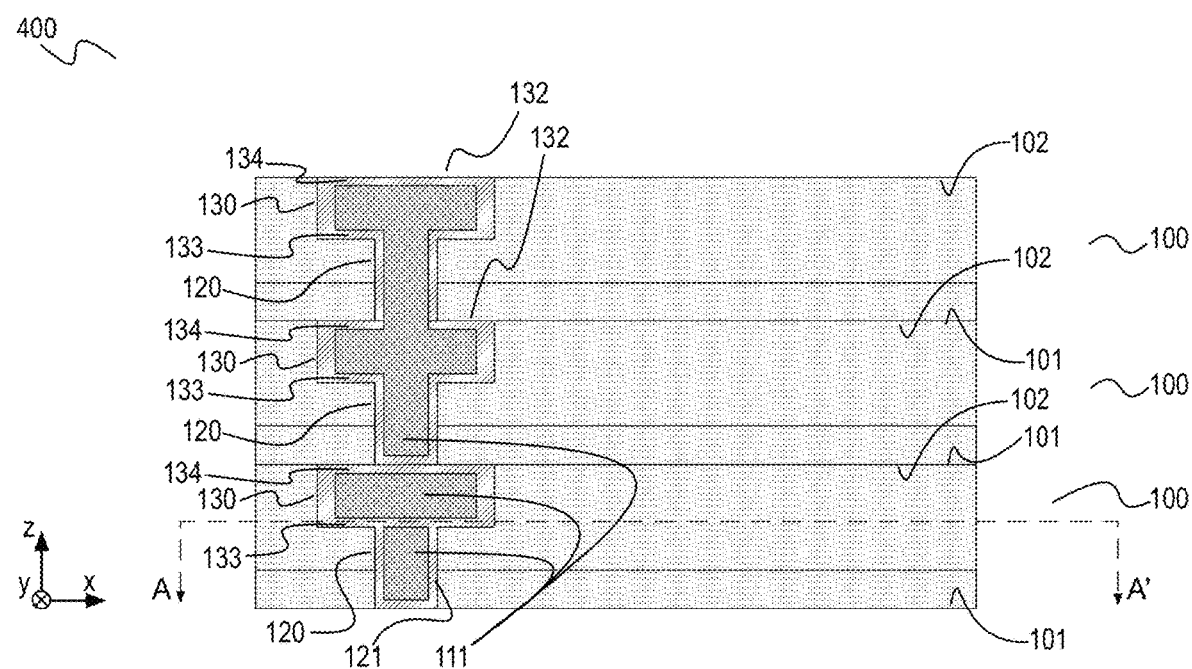

FIG. 4A illustrates a cross-sectional top view and FIG. 4B illustrates a cross-sectional side view of an example system 400 of stacked and thermally coupled integrated circuit dies 100, including vias 120 and trenches 130 holding thermoresponsive materials 111, arranged in accordance with at least some implementations of the present disclosure. For example, FIG. 4B provides a cross sectional view at B-B' as shown in FIG. 4A, and FIG. 4A provides a cross sectional view at A-A' as shown in FIG. 4B. FIG. 4A shows bottom layer 133 of trench 130 in the bottom integrated circuit die 100. Trench 130 and via 120 are not in fluid communication in the bottom integrated circuit die 100, and bottom layer 133 has no openings. FIG. 4B shows an example with multiples integrated circuit dies 100 stacked and aligned such that vias 120 in each successive integrated circuit die 100 thermally couple to vias 120 (and optional trenches 130) in the other integrated circuit dies 100. Upper surface 132 of trench 130 forms part of and is substantially planar with upper surface 102 of the top integrated circuit die 100 in FIG. 4. Vias 120 extend vertically through integrated circuit dies 100, up from lower surfaces 101. Trenches 130 extend into integrated circuit dies 100 from upper surfaces 102. In the examples shown, vias 120 are lined with via layers 121.

Integrated circuit dies 100 can be stacked one on top of the other. If desired, integrated circuit dies 100 can be joined, e.g., by bonding film between upper surfaces 102 of lower integrated circuit dies 100 and lower surfaces 101 of higher integrated circuit dies 100. Such a bonding film can have cutouts where desired to allow for connections, e.g., electrical connections. Integrated circuit dies 100 can be designed and aligned such that heat conducting structures, e.g., vias 120 and trenches 130, on each successive integrated circuit die 100 are thermally coupled to one other. In this way, thermal energy can be transferred not just from the heat-generating areas to thermoresponsive materials 111 in vias 120 and trenches 130 within integrated circuit dies 100, but also from one integrated circuit die 100 to another. In some embodiments, integrated circuit dies 100 are stacked five high. Integrated circuit dies 100 can be stacked higher still if thermal considerations are accounted for. In some embodiments, integrated circuit dies 100 are stacked seven high.

As before, thermal energy is transferred away from the heat-generating and sensitive areas of integrated circuit dies 100 and into the heat sinks of vias 120 and trenches 130 and the thermoresponsive materials 111 they contain. The thermoresponsive materials 111 in vias 120 and trenches 130 can act as heat reservoirs and channels for the transfer of thermal energy out of any given integrated circuit die 100. In some embodiments, the lowermost integrated circuit die 100 will be the hottest and heat will be transferred generally upward and from right to left as thermal energy from the heat-generating areas of integrated circuit dies 100 to the cooler heat sinks of thermoresponsive materials 111 in vias 120 and trenches 130. This thermal energy can be transferred vertically, e.g., through vias 120 of integrated circuit dies 100, and dissipated upward. In some embodiments, a heat spreader will be positioned above the uppermost integrated circuit die 100, thermally coupled to thermoresponsive materials 111 in trench 130 there. Without these channels designed for enhanced heat transfer, the thermal energy from the heat-generating areas in the lowermost and hottest integrated circuit die 100 would be separated (and insulated) from a heat spreader above the uppermost integrated circuit die 100 by the heat-generating areas in other integrated circuit dies 100. With thermoresponsive materials 111 in vias 120 and trenches 130 acting as heat reservoirs and channels for the transfer of thermal energy out and around the heat-generating areas of integrated circuit dies 100, the heat-generating areas (which can be the most heat-sensitive portions of integrated circuit dies 100) can be more effectively cooled and so operate at lower temperatures.

In some embodiments, vias 120 of different integrated circuit dies 100 will be open at their coupled surfaces such that vias 120 are in fluid communication with each other and the thermoresponsive materials 111 they contain can be shared within a shared, vertical, thermally coupled channel. Such fluid communication between integrated circuit dies 100 can enable enhanced heat transfer utilizing convection currents, particularly when using thermoresponsive materials 111, such as thermoresponsive polymer gels, with sufficiently low viscosities. In this way, thermoresponsive materials 111 can be chosen to increase heat transfer by convection as the thermoresponsive materials 111 absorb more thermal energy.

In some embodiments, trenches 130 will be open at their coupled surfaces with vias 120 and so will be in fluid communication with each other. The thermoresponsive materials 111 they contain can be shared within a thermally coupled channel. In this way, a network of heat-transfer structures with thermoresponsive materials 111 can be made larger and more interconnected, which can better enable the transfer of thermal energy from the heat-generating and sensitive areas of integrated circuit dies 100 to, e.g., heat spreaders or other off-die structures.

In some embodiments, vias 120 will not be in fluid communication with each other and will be thermally coupled to each other by conduction at connection points. Likewise, vias 120 and trenches 130 need not be in fluid communication with each other and can be thermally coupled to each other by conduction at connection points.

The stack of three integrated circuit dies 100 shows different examples for connections between adjacent vias 120 and trenches 130. In top and middle integrated circuit dies 100, there is an opening in bottom layer 133, and via 120 and trench 130 are in fluid communication. Thermoresponsive material 111 is able to flow, and transfer heat by convection, between via 120 and trench 130. Top integrated circuit die 100 is also in fluid communication with middle integrated circuit die 100, and convective heat flow through thermoresponsive material 111 is able to dissipate up from the bottom of middle integrated circuit die 100 to the top of top integrated circuit die 100. In bottom integrated circuit die 100, bottom layer 133 has no openings, and via 120 and trench 130 are not in fluid communication. Thermal energy is transferred from thermoresponsive material 111 in via 120 of bottom integrated circuit die 100 to via 120 of middle integrated circuit die 100 by conduction and convection within the vias 120 and trench 130 of bottom integrated circuit die 100 and by conduction between the respective layers of the structures. In some embodiments, optional via layers 121 and bottom layers 133 and top layers 134 of trenches 130 are formed with highly thermally conductive materials, such as metals like copper.

In some embodiments, integrated circuit dies 100 may not utilize trenches 130. Optional trench 130 on upper surface 102 of uppermost integrated circuit die 100 of the stack can help dissipate heat by transmitting thermal energy to any optional structures positioned above the stack of integrated circuit dies 100, such as a heat spreader. Other optional trenches 130 on intermediate integrated circuit die 100 of the stack can serve as heat reservoirs and connections and can help dissipate heat to structures on next integrated circuit die 100 up in stack.

In some embodiments, vias 120 may connect and thermally couple vertically other vias 120 while yet other vias 120 are coupled to trenches 130. Such design decisions can be made based on processing costs and capabilities, as well on thermal requirements for given integrated circuit dies 100. In some embodiments, integrated circuit dies 100 will have multiple trenches 130.

Figure 5:
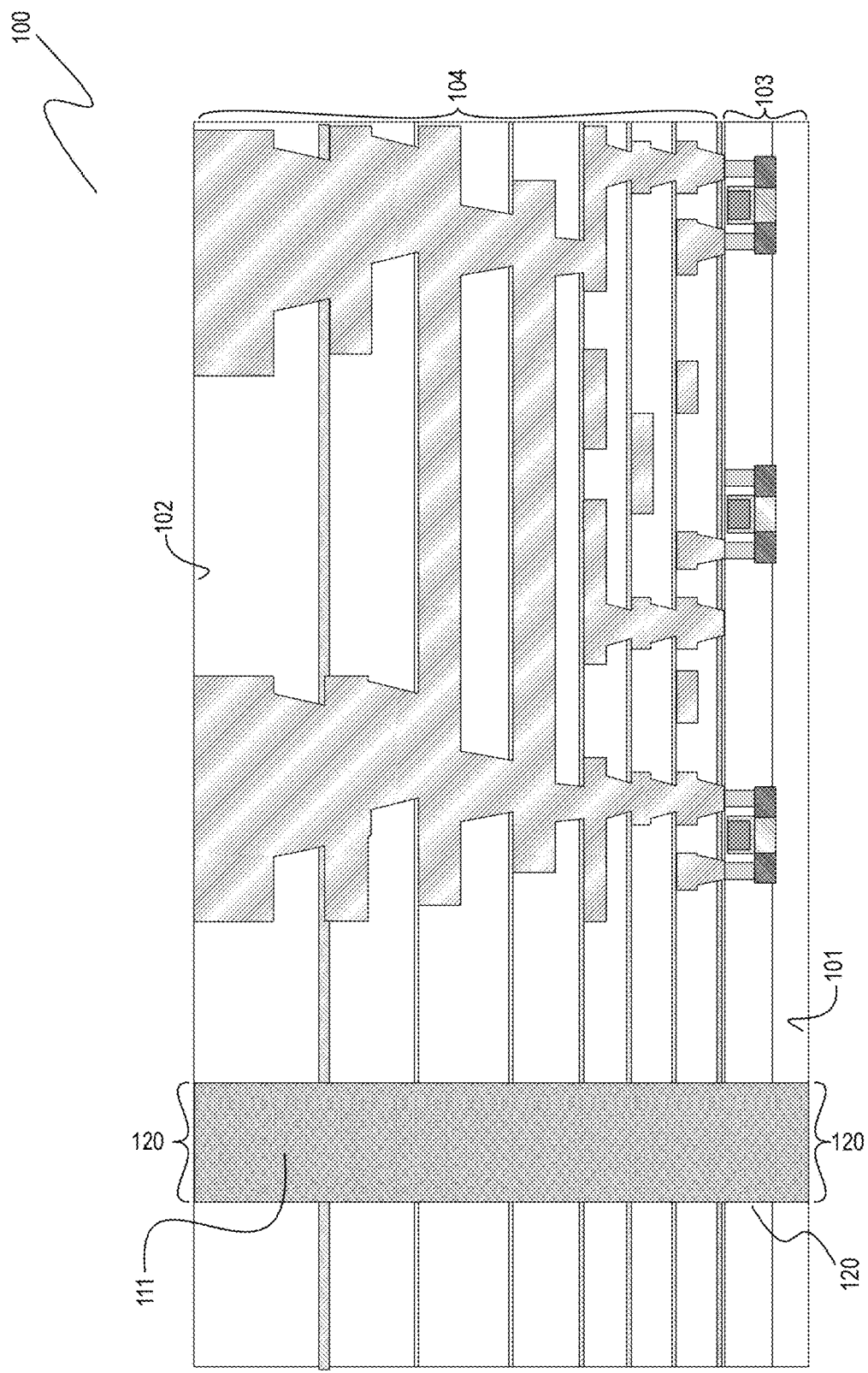
FIG. 5 illustrates a cross-sectional side view of an example integrated circuit die, including a via holding thermoresponsive material.

FIG. 5 illustrates a cross-sectional side view of an example integrated circuit die 100, including via 120 holding thermoresponsive material 111, arranged in accordance with at least some implementations of the present disclosure. As shown in FIG. 5, via 120 extends vertically through integrated circuit die 100, up from lower surface 101 through device layer 103 and metallization layers 104 to upper surface 102. To the right of via 120 are heat-generating structures, e.g., transistors, etc., in device layer 103 and current-carrying conductors in metallization layers 104. Via 120 and integrated circuit die 100 are configured to be coupled to other vias 120 and integrated circuit dies 100 respectively. Thermoresponsive material 111 is contained horizontally by via 120 but extends to lower surface 101 and upper surface 102 of integrated circuit die 100. Via 120 can be in fluid communication with vias 120 of other integrated circuit dies 100, and those vias 120 will also contain thermoresponsive material 111, such that thermoresponsive material 111 can flow between the various vias 120.

Heat generated in integrated circuit die 100, for example, by transistors in device layer 103 and current-carrying conductors in metallization layers 104, can flow horizontally to via 120 and thermoresponsive material 111 contained within via 120. This thermal energy can be dissipated vertically through thermoresponsive material 111 within via 120. Since via 120 is in fluid communication with vias 120 of other integrated circuit dies 100, this vertical transfer of heat can be by conduction, but also by convection, particularly with thermoresponsive materials 111 of sufficiently low viscosities, for example, thermoresponsive polymer gels that become more fluid as they absorb more thermal energy. In some embodiments, thermoresponsive materials 111 include lithium nitrate trihydrate and poly(vinyl alcohol).

Figure 6:
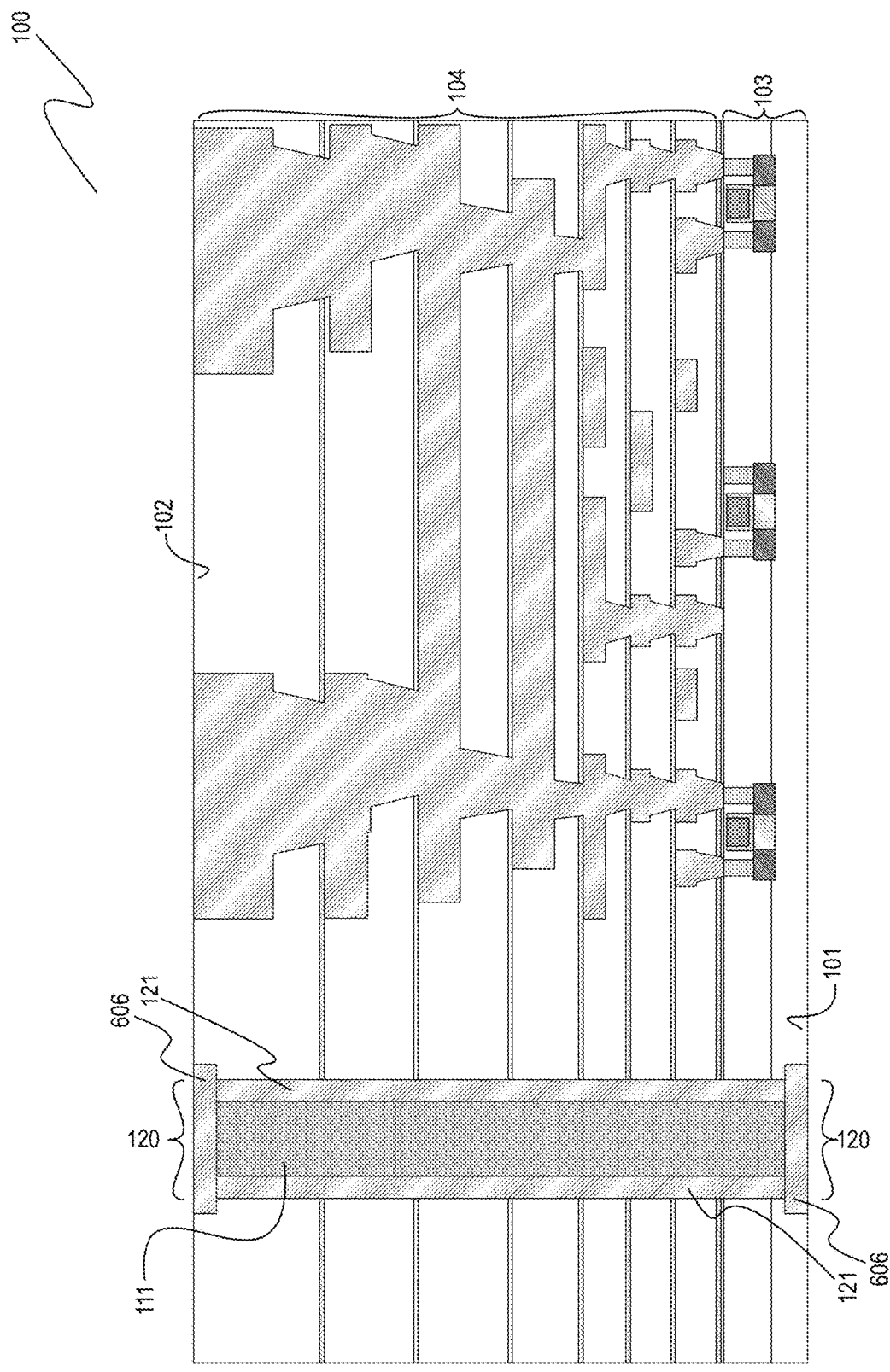
FIG. 6 illustrates a cross-sectional side view of an example integrated circuit die, including a via holding thermoresponsive material.

FIG. 6 illustrates a cross-sectional side view of an example integrated circuit die 100, including via 120 holding thermoresponsive material 111, arranged in accordance with at least some implementations of the present disclosure. As shown in FIG. 6, via 120 extends vertically through integrated circuit die 100, up from lower surface 101 through device layer 103 and metallization layers 104 to upper surface 102. To the right of via 120 are heat-generating structures, e.g., transistors in device layer 103 and current-carrying conductors in metallization layers 104. Via 120 and integrated circuit die 100 are configured to be coupled to other structures and integrated circuit dies 100. Thermoresponsive material 111 is contained within via 120 by optional via layer 121 and, at lower surface 101 and upper surface 102, metal pads 606, which cap via 120 at its ends, the respective surfaces of integrated circuit die 100.

Metal pads 606 do not allow fluid communication with vias 120 of other integrated circuit dies 100, but instead provide thermally conductive surfaces to allow for high heat flux between vertically adjacent integrated circuit dies 100 with similarly capped vias 120 or with trenches. In some embodiments, capping of vias 120 with metal pads 606 may allow for simpler manufacturing and assembly in some applications as individual integrated circuit dies 100 can be separately processed, including the filling of vias 120 with thermoresponsive materials 111, before integrated circuit dies 100 are coupled. In some embodiments, capping vias 120 with metal pads 606 allows for thermally coupling those integrated circuit dies 100 with structures not containing thermoresponsive materials 111, such as substrates and heat spreaders. In some embodiments, vias 120 will have one end capped with metal pads 606 and one end open to allow for connecting to and fluid communication with other open-ended vias 120. In some embodiments, integrated circuit die 100 has multiple vias 120, some with one or more vias 120 capped on one or both ends. In some embodiments, integrated circuit die 100 has multiple vias 120, some with one or more vias 120 open on one or both ends.

The materials of optional via layers 121 can be chosen to enhance heat transfer as well. Forming the via layers 121 with thermally conductive materials can enhance vertical heat transfer to other integrated circuit dies 100. The use of thermally conductive materials can also minimize any insulating effects of optional via layers 121 as they are between the heat-generating structures of integrated circuit die 100 and thermoresponsive materials 111. In some embodiments, via layer 121 includes copper. In some embodiments, via layer 121 includes aluminum.

Figure 7:
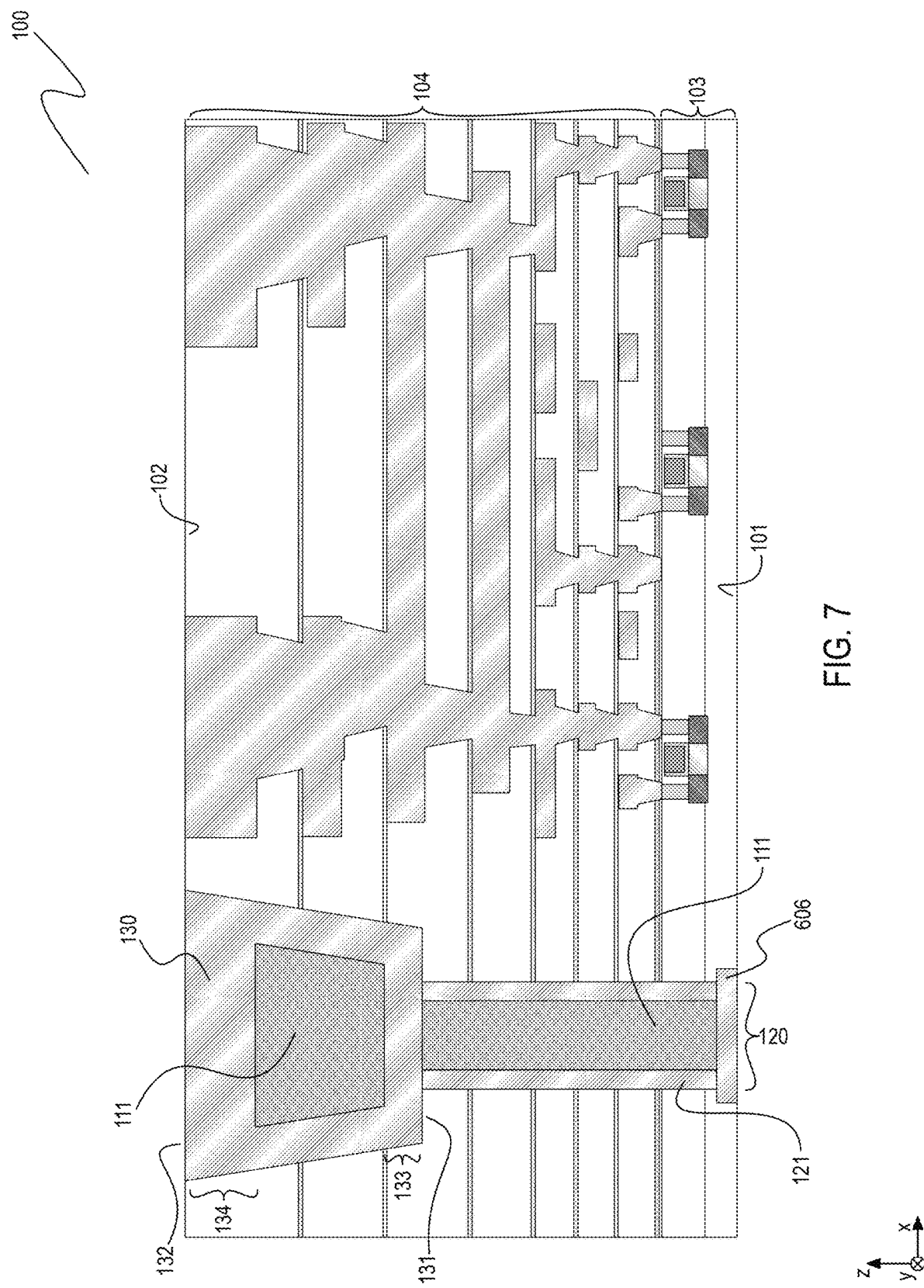
FIG. 7 illustrates a cross-sectional side view of an example integrated circuit die, including a via and a trench holding thermoresponsive materials.

FIG. 7 illustrates a cross-sectional side view of an example integrated circuit die 100, including via 120 and trench 130 holding thermoresponsive materials 111, arranged in accordance with at least some implementations of the present disclosure. As shown in FIG. 7, via 120 extends vertically, up from lower surface 101 of integrated circuit die 100, through device layer 103 and some metallization layers 104. Via 120 is lined by optional via layer 121. Via 120 connects to, and is capped at its upper end by, trench 130 at a lower surface 131 of bottom layer 133 of trench 130. Trench 130 has an upper surface 132 of top layer 134. Upper surface 132 of trench 130 is part of and is substantially planar with upper surface 102 of integrated circuit die 100. Trench 130 extends into integrated circuit die 100 through some of metallization layers 104. To the right of via 120 and trench 130 are heat-generating structures, e.g., transistors in device layer 103 and current-carrying conductors in metallization layers 104. Via 120, trench 130, and integrated circuit die 100 are configured to be coupled to other structures and integrated circuit dies 100. Thermoresponsive materials 111 are contained in via 120 (capped by metal pad 606 at lower surface 101 of integrated circuit die 100) and trench 130.

In the example shown in FIG. 7, trench 130 adds increased capacity to store thermal energy by adding to the volume of thermoresponsive materials 111 held in integrated circuit die 100. Trench 130 is wider than via 120 and can be made to hold more thermoresponsive materials 111. Even by slightly increasing the length and depth of trench 130, the total heat capacity of integrated circuit die 100 can be enhanced. This can aid in heat management of integrated circuit die 100 by providing a heat reservoir to absorb thermal energy away from the heat-generating and sensitive areas of integrated circuit die 100.

In addition to adding capacity for thermal storage, trench 130 can perform a valuable heat spreading function. Trench 130 can be sized to thermally couple with structures positioned above integrated circuit die 100 to dissipate heat, such as heat spreaders or vias 120 in other integrated circuit dies 100. In some embodiments, integrated circuit die 100 has one via 120 holding thermoresponsive materials 111 and trench 130 provides valuable heat spreading and coupling to other structures above integrated circuit dies 100. In some embodiments, integrated circuit die 100 has multiple vias 120 holding thermoresponsive materials 111 and trench 130 physically connects and thermally couples them. In some embodiments, via 120 is open at lower surface 101 (with no metal cap 606) and is in fluid communication with via 120 or trench 130 of a vertically adjacent integrated circuit die 100 below.

Figure 8:
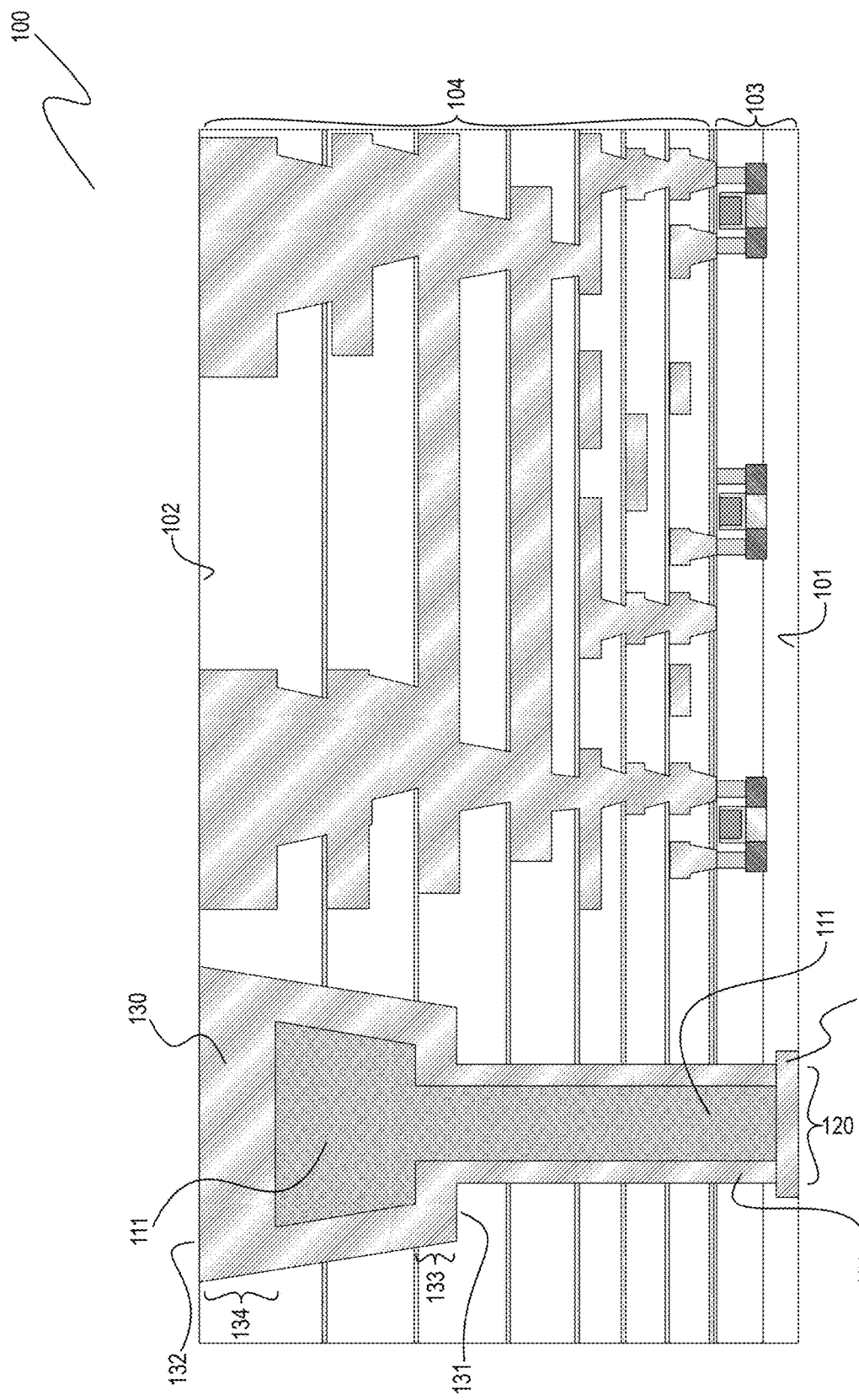
FIG. 8 illustrates a cross-sectional side view of an example integrated circuit die, including a via and a trench holding thermoresponsive materials.

FIG. 8 illustrates a cross-sectional side view of an example integrated circuit die 100, including via 120 and trench 130 holding thermoresponsive materials 111, arranged in accordance with at least some implementations of the present disclosure. As shown in FIG. 8, via 120 extends vertically, up from lower surface 101 of integrated circuit die 100, through device layer 103 and some metallization layers 104. Via 120 is lined by optional via layer 121. Via 120 is open at its upper end and connects to trench 130 at an opening in lower surface 131 of bottom layer 133 of trench 130. Trench 130 has an upper surface 132 of top layer 134. Upper surface 132 of trench 130 is part of and is substantially planar with upper surface 102 of integrated circuit die 100. Trench 130 extends into integrated circuit die 100 through some of metallization layers 104. To the right of via 120 and trench 130 are heat-generating structures, e.g., transistors in device layer 103 and current-carrying conductors in metallization layers 104. Via 120, trench 130, and integrated circuit die 100 are configured to be coupled to other structures and integrated circuit dies 100. Thermoresponsive materials 111 are contained in via 120 (capped by metal pad 606 at lower surface 101 of integrated circuit die 100) and trench 130.

In the example shown in FIG. 8, trench 130 is in fluid communication with via 120, which can enable increased heat transfer by convection flow as heat is absorbed by thermoresponsive material 111. As in previous examples, trench 130 can provide increased thermal storage capacity and can enhance heat dissipation through upper surface 132 to vertically adjacent integrated circuit die 100 above or to, e.g., a heat spreader. This heat dissipation can be further improved by the convection-enhanced thermal coupling allowed for by the opening in bottom layer 133. In some embodiments, via 120 is open at lower surface 101 (with no metal cap 606) and via 120 and trench 130 are in fluid communication with via 120 or trench 130 of a vertically adjacent integrated circuit die 100 below. In some embodiments, trench 130 has multiple openings in lower surface 131 of bottom layer 133 and is in fluid communication with multiple vias 120 in integrated circuit die 100.

Figure 9:
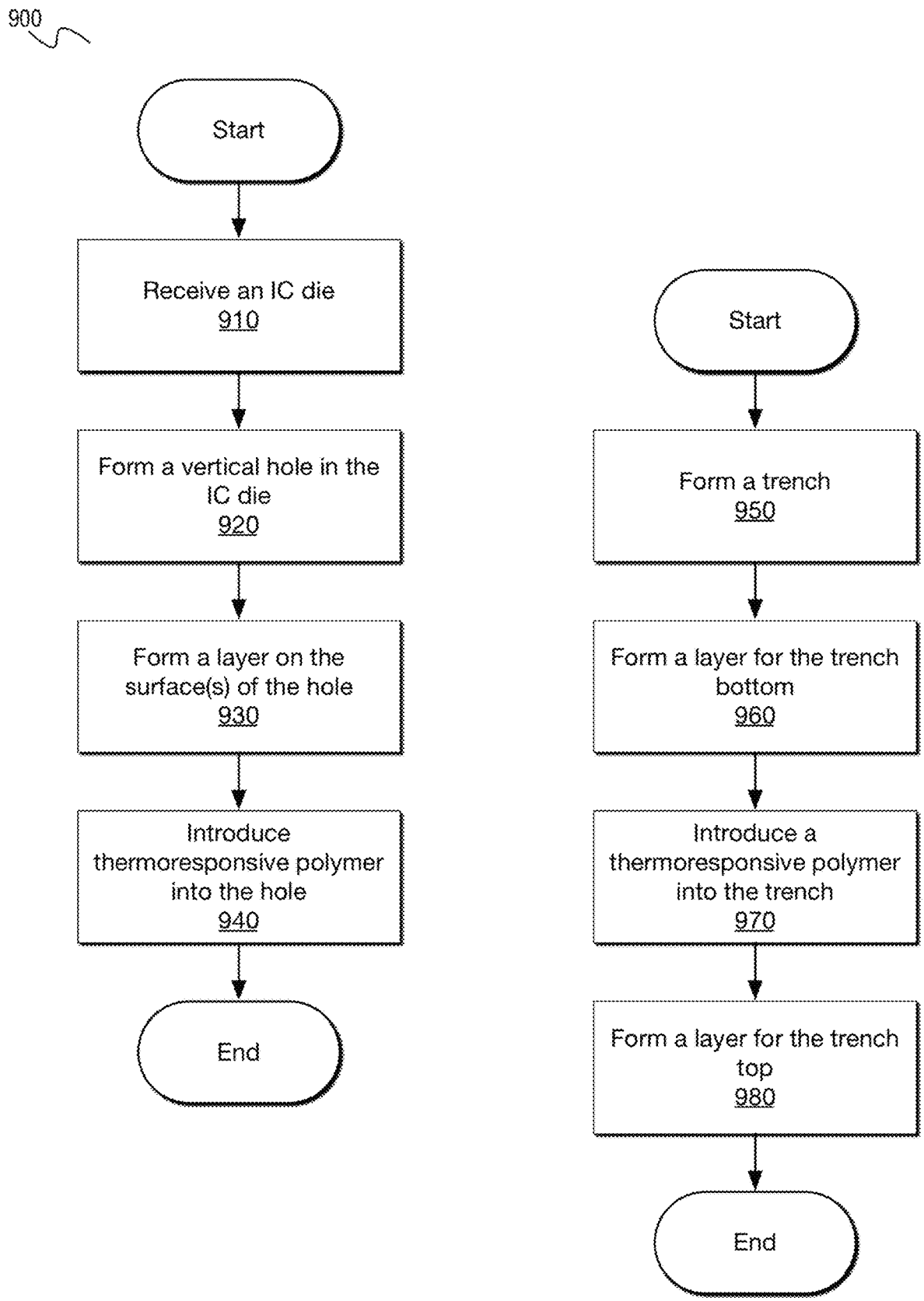
FIG. 9 illustrates various processes or methods for forming vias and trenches with thermoresponsive materials in integrated circuit dies.

FIG. 9 illustrates various processes or methods 900 for forming vias and trenches with thermoresponsive materials in integrated circuit dies, arranged in accordance with at least some implementations of the present disclosure. The process to form and fill an integrated circuit die via with thermoresponsive material can include operations 910, 920, 930, and 940. Optional operations 950, 960, 970, and 980 describe how to form and fill a trench with thermoresponsive material.

Given an integrated circuit die with two opposing surfaces, a hole can be formed in (and substantially orthogonal to) the first surface. This is shown in operations 910 and 920. The hole can be, for example, etched, mechanically drilled, otherwise bored, e.g., by a laser, etc. The hole can be completely or partially through the integrated circuit die.

Operation 930 is optional and shows that a layer may be formed on the surface(s) of the hole. The layer may be formed with a purpose of containing a thermoresponsive material, such as a thermoresponsive polymer gel, and of thermally coupling the thermoresponsive material to the integrated circuit die. Supposing an example with a substantially cylindrical hole drilled downward and partially into the integrated circuit die, the layer can be formed on the single, continuous side wall of the cylinder, as well as on the bottom surface(s) of the rough cylinder. In some embodiments, the layer is formed with metal, such as copper or aluminum. In some embodiments, the layer is plated onto the surface(s). In some embodiments, the layer is otherwise deposited (e.g., by vapor or other chemical deposition) onto the surface(s). In some embodiments, the hole will be completely through the integrated circuit die to a second surface. In some such embodiments, a metal pad is placed over the hole. In some embodiments, the metal pad is square. In some embodiments, the metal pad is circular. The metal pad can act as a cap on the end of the hole to contain thermoresponsive material and to thermally couple the thermoresponsive material (and the integrated circuit die) to other integrated circuit dies. In some embodiments, the metal pad is formed at the second surface of the integrated circuit die before the hole is formed. The metal pad may act as an etch stop or drill stop when forming the hole.

Operation 940 shows that a thermoresponsive material should be introduced into the hole. In some embodiments, the thermoresponsive material is deposited on the containment layer in the hole. In some embodiments, the thermoresponsive material is introduced by plugging and squeeze printing. In some embodiments, the thermoresponsive material is poured into the hole. In some embodiments, the hole is filled with thermoresponsive material at the integrated circuit die's initial point of manufacture. In some embodiments, the thermoresponsive material is introduced at a later point, such as when one or more integrated circuit dies are assembled into a larger device. In some embodiments, multiple integrated circuit dies, each with holes configured to contain thermoresponsive material, are joined together with their holes aligned before the new, common hole is filled with thermoresponsive material.

Given the integrated circuit die with a hole in (at least) a first surface, a trench can be formed in the opposing second surface. This is shown in operation 950. The trench can be formed mechanically (e.g., by chiseling or drilling), chemically (e.g., by etching), or by any other method (e.g., by laser ablation) that creates a suitable space to contain thermoresponsive material. Operation 950 need not be the first operation performed.

Operation 960 shows that a layer should be formed to make the bottom surface(s) of the trench. Layer materials may be limited, e.g., by cost or ease of processing, but may be chosen to contain a thermoresponsive material and to thermally couple the thermoresponsive material to the integrated circuit die. In some embodiments, the layer is formed with metal, such as copper or aluminum. In some embodiments, the layer is plated onto the surface(s). In some embodiments, the layer is deposited (e.g., by vapor or other chemical deposition) onto the surface(s). In some embodiments, the bottom layer is formed before the trench is formed in the integrated circuit die, e.g., when the trench is etched down an already-formed bottom layer.

A thermoresponsive material should be introduced into the trench, as shown in operation 970. In some embodiments, the thermoresponsive material is deposited on the layer formed in the trench. In some embodiments, the thermoresponsive material is introduced by plugging and squeeze printing. In some embodiments, the thermoresponsive material is poured into the trench. In some embodiments, the trench is filled with thermoresponsive material at the integrated circuit die's initial point of manufacture. In some embodiments, the thermoresponsive material is introduced at a later point, such as when one or more integrated circuit dies are assembled into a larger device. In some embodiments, multiple integrated circuit dies, each with vias and/or trenches configured to contain thermoresponsive material, are joined together with their vias and/or trenches aligned with vias before the new, combined container is filled with thermoresponsive material. In some embodiments, the thermoresponsive material can be introduced after a top layer is formed. For example, the trench may be etched out from between two already-formed layers. In some embodiments, the trench is capped. The cap may help in the processing of the trench, including in forming a top layer. Any suitable material may be used as a cap. In some embodiments, the cap acts as a mechanical support for forming a top layer. In some embodiments, the cap acts as a seed layer for depositing a top layer.

Operation 980 shows that a top layer of the trench should be formed. Layer materials may be limited, e.g., by cost or ease of processing, but may be chosen to contain a thermoresponsive material and to thermally couple the thermoresponsive material to the integrated circuit die and/or off of the integrated circuit die, for example, to vertically adjacent integrated circuit dies or, e.g., heat spreaders or similar structures to enhance heat dissipation. In some embodiments, the layer is formed with metal, such as copper or aluminum. In some embodiments, the layer is plated onto the surface(s). In some embodiments, the layer is deposited (e.g., by vapor or other chemical deposition) onto the surface(s). In some embodiments, the top layer is formed before the trench is formed in the integrated circuit die, e.g., when the trench is etched between already-formed top and bottom layers.

With these methods, vias and trenches can be formed in integrated circuit dies and filled with thermoresponsive material to enhance heat dissipation away from the heat-generating and sensitive areas of integrated circuit dies. Such heat can be transferred to, e.g., other integrated circuit dies.

Figure 10:
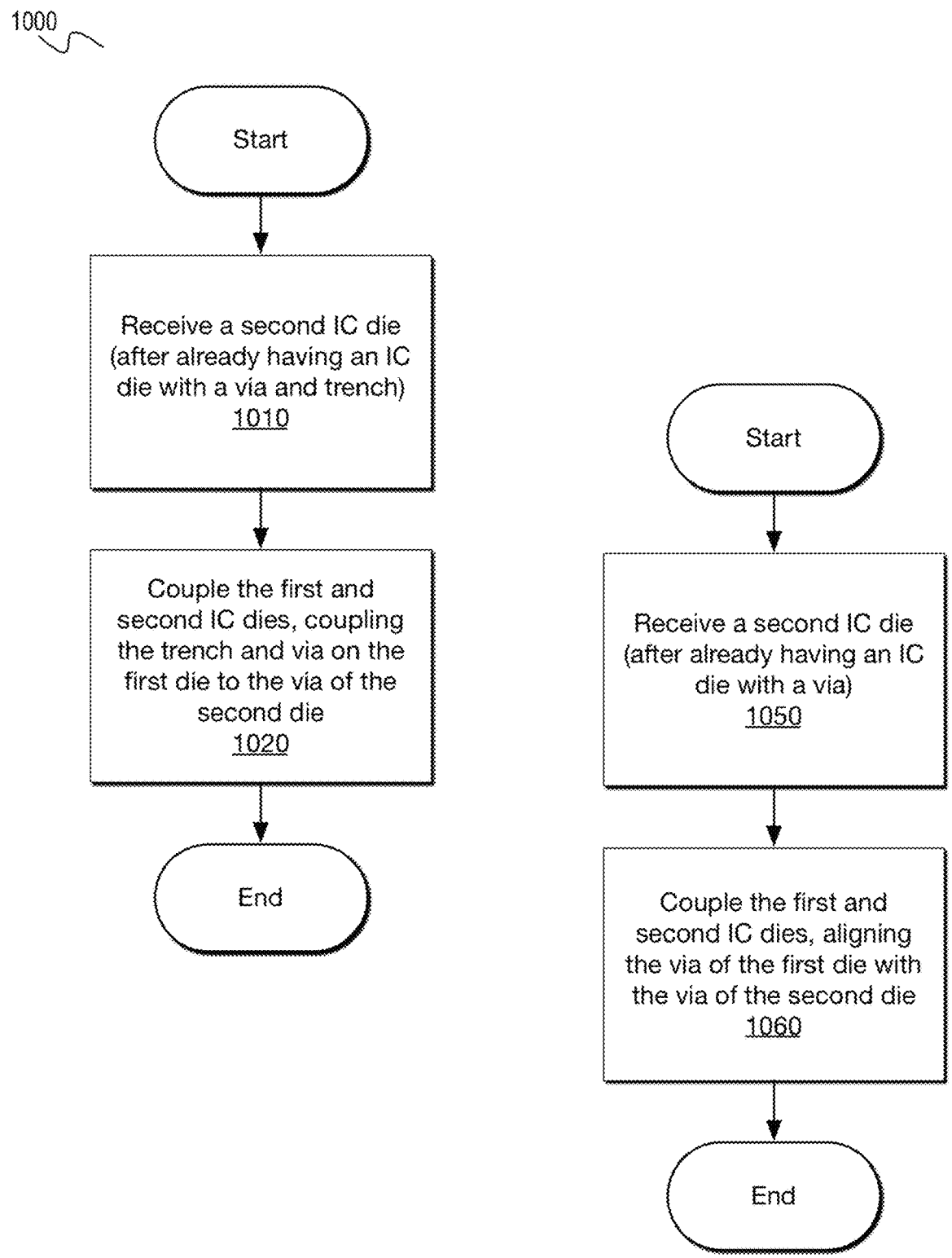
FIG. 10 illustrates various processes or methods for coupling multiple integrated circuit dies and coupling their vias and trenches.

FIG. 10 illustrates various processes or methods 1000 for coupling multiple integrated circuit dies and coupling their vias and trenches, arranged in accordance with at least some implementations of the present disclosure.

Given the integrated circuit die already having a hole in (at least) one surface and a trench in the opposing surface, both containers configured to hold thermoresponsive material, and then given another integrated circuit die with a hole configured to hold thermoresponsive material, the two integrated circuit dies can be coupled together. This is shown in operations 1010 and 1020. The second integrated circuit die should be aligned with and stacked on top of the first integrated circuit die such that the hole on the bottom side of the second integrated circuit die (and its thermoresponsive material) is thermally coupled to the top of the trench in the first integrated circuit die (and its thermoresponsive material). The integrated circuit dies can be joined in much the usual ways. In some embodiments, the integrated circuit dies will be bonded together, for example, with a bonding film with necessary cutouts, e.g., for electrical or fluid connections. In some embodiments, the integrated circuit dies will be connected by soldering or sintering bonding pads together. In some embodiments, the hole on the bottom surface of the second integrated circuit die will be closed or capped, e.g., with a metal pad at the end of a via, and can be thermally coupled by a thermally conductive connection between the lower end of the via and the upper surface of the trench in the first integrated circuit die. In some embodiments, the hole on the bottom surface of the second integrated circuit die will be open and will allow fluid communication between the hole in the second integrated circuit die and a trench in the first integrated circuit die with an opening in its upper surface. Such connections enable thermal coupling by convective flow of heat. In some embodiments, each integrated circuit die in a stack of multiple integrated circuit dies will have multiple vias holding thermoresponsive materials to align and thermally couple to structures on a vertically adjacent integrated circuit die. In some embodiments, each integrated circuit die in a stack of multiple integrated circuit dies will have both a via and a trench holding thermoresponsive materials to align and thermally couple to structures on a vertically adjacent integrated circuit die. In some embodiments, each integrated circuit die in a stack of multiple integrated circuit dies will have multiple trenches holding thermoresponsive materials to align and thermally couple to structures on a vertically adjacent integrated circuit die.

Given two integrated circuit dies, each with a hole configured to hold thermoresponsive material (with at least one integrated circuit die having a through hole that extends from one surface to the other), the integrated circuit dies can be coupled together. This is seen in operations 1050 and 1060. One integrated circuit die should be aligned with and stacked on top of a second integrated circuit die with a through hole such that the hole on the bottom side of the first integrated circuit die is thermally coupled to the top of the hole in the second integrated circuit die. The holes can be aligned. In some embodiments, the holes are coaxially aligned. The integrated circuit dies can be joined in much the usual ways. In some embodiments, the integrated circuit dies will be bonded together, for example, with a bonding film with necessary cutouts, e.g., for electrical or fluid connections. In some embodiments, the integrated circuit dies will be connected by soldering or sintering bonding pads together. In some embodiments, the holes on the surfaces to be joined will both be closed or capped, e.g., with a metal pad at the end of a via, and can be thermally coupled by a thermally conductive connection between the two pads. In some embodiments, the holes on the surfaces to be coupled will both be open and will allow fluid communication between the holes. Such connections enable thermal coupling by convective flow of heat. In some embodiments with holes in fluid communication, the integrated circuit dies can be manufactured in accordance with earlier descriptions, and the thermoresponsive material is not introduced until after the integrated circuit dies are joined together. That is, in some embodiments, the holes and containment layers are formed and the integrated circuit dies are joined together before the operation of introducing thermoresponsive material is performed to both dies at once. In some embodiments, more than two integrated circuit dies will be stacked (with all of them, or all but the top die, having through holes) with their holes coaxially aligned and thermally coupled as previously described with pairs of dies.

Figure 11:
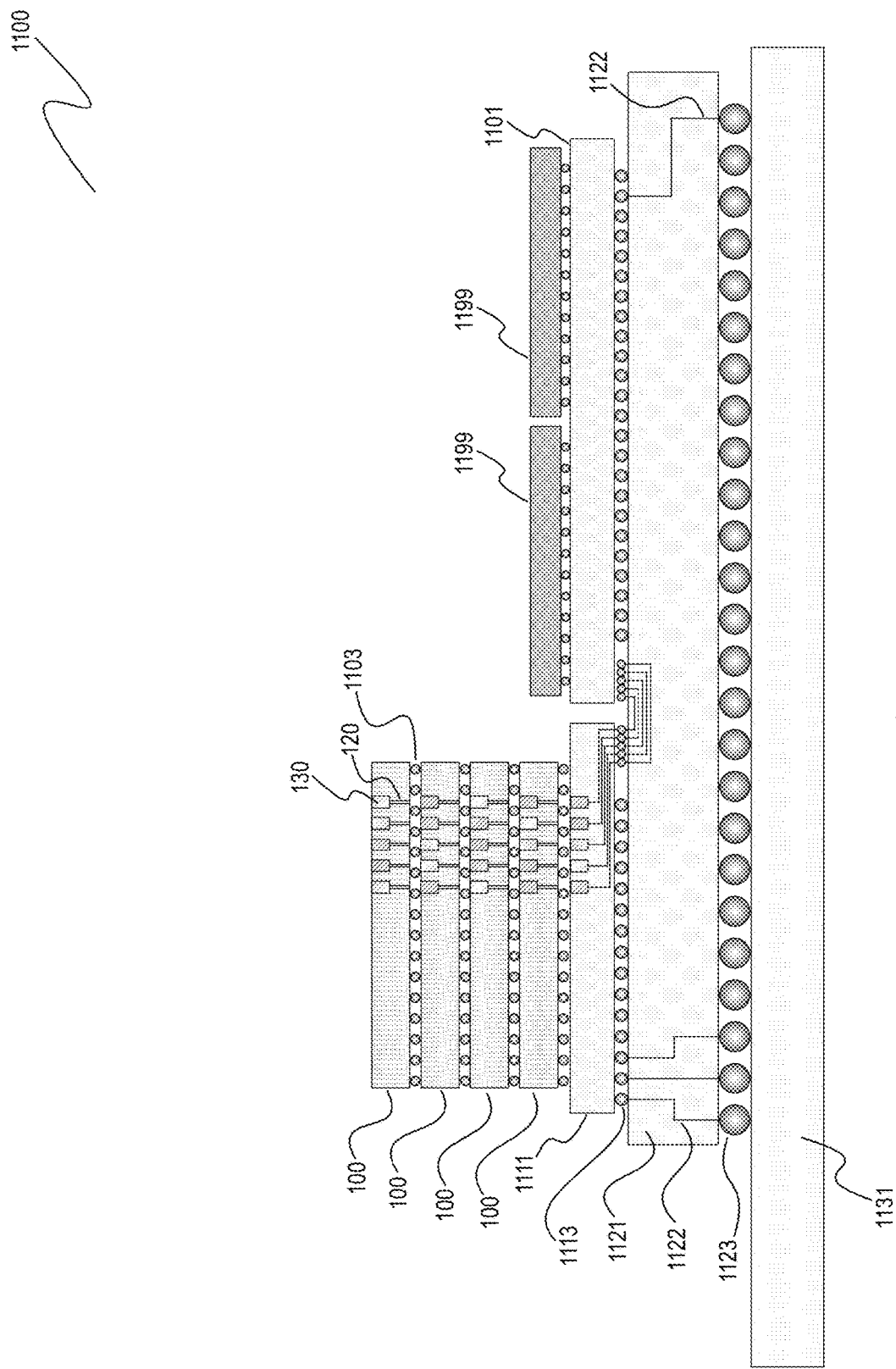
FIG. 11 illustrates a side view of an example system with multiple integrated circuit dies with vias and trenches holding thermoresponsive materials, and other components electrically connected to a package substrate, which is mounted on a circuit board.

FIG. 11 illustrates a side view of an example system 1100 with multiple integrated circuit dies 100 with vias 120 and trenches 130 holding thermoresponsive materials, and other components electrically connected to a package substrate 1121, which is mounted on a circuit board 1131, arranged in accordance with at least some implementations of the present disclosure. As shown in FIG. 11, integrated circuit dies 100 are stacked on top of each other and on top of a base die 1111 and are interconnected by microbumps 1103. (The rows of microbumps 1103 are shown to illustrate the connections between vertically adjacent integrated circuit dies 100 but do not necessarily indicate that vias 120 and trenches 130 in vertically adjacent integrated circuit dies 100 are connected by solder.) Base die 1111 is connected to package substrate 1121 by solder bumps 1113. Package substrate 1121 is connected to circuit board 1131 by package balls 1123. Various metal traces, vias, etc.—some of which are shown; some of which are not—interconnect various components. For example, various package traces 1122 run through package substrate 1121 and electrically connect, e.g., base dies 1111 to circuit board 1131. Unstacked other dies 1199 are connected to their base die 1111 but are not otherwise stacked to other dies 1199 and do not utilize thermoresponsive materials.

Multiple integrated circuit dies 100 are stacked on top of each other and use vias 120 and trenches 130 holding thermoresponsive materials to enhance cooling of integrated circuit dies 100 in the stack. Vias 120 and trenches 130 and the thermoresponsive materials they hold are used to manage the heat generated in and dissipated through the stack of multiple integrated circuit dies 100. The multiple integrated circuit dies 100 are able to be stacked four dies high because of the enhanced cooling and thermal management provided by the thermoresponsive materials and supporting structures, such as vias 120 and trenches 130. Other dies 1199 are not stacked because they lack sufficient cooling to operate at acceptably low temperatures with multiple other dies 1199 on top of each other. In some embodiments, integrated circuit dies 100 have vias 120 and trenches 130 in fluid communications with other vias 120 and trenches 130 such that the thermoresponsive materials they contain can transfer heat convectively between the integrated circuit dies 100. In some embodiments, integrated circuit dies 100 have vias 120 and trenches 130 not in fluid communications with other vias 120 and trenches 130 such that the thermoresponsive materials they contain transfer heat conductively between the integrated circuit dies 100. In some embodiments, multiple integrated circuit dies 100 are stacked more than four dies high. In some embodiments, thermal management devices, e.g., heat spreaders, external to integrated circuit dies 100 may be thermally coupled to integrated circuit dies 100, for example, above the uppermost integrated circuit die 100. In some embodiments, some integrated circuit dies 100 will have thermoresponsive materials within vias 120 but will not utilize trenches 130.

Figure 12:
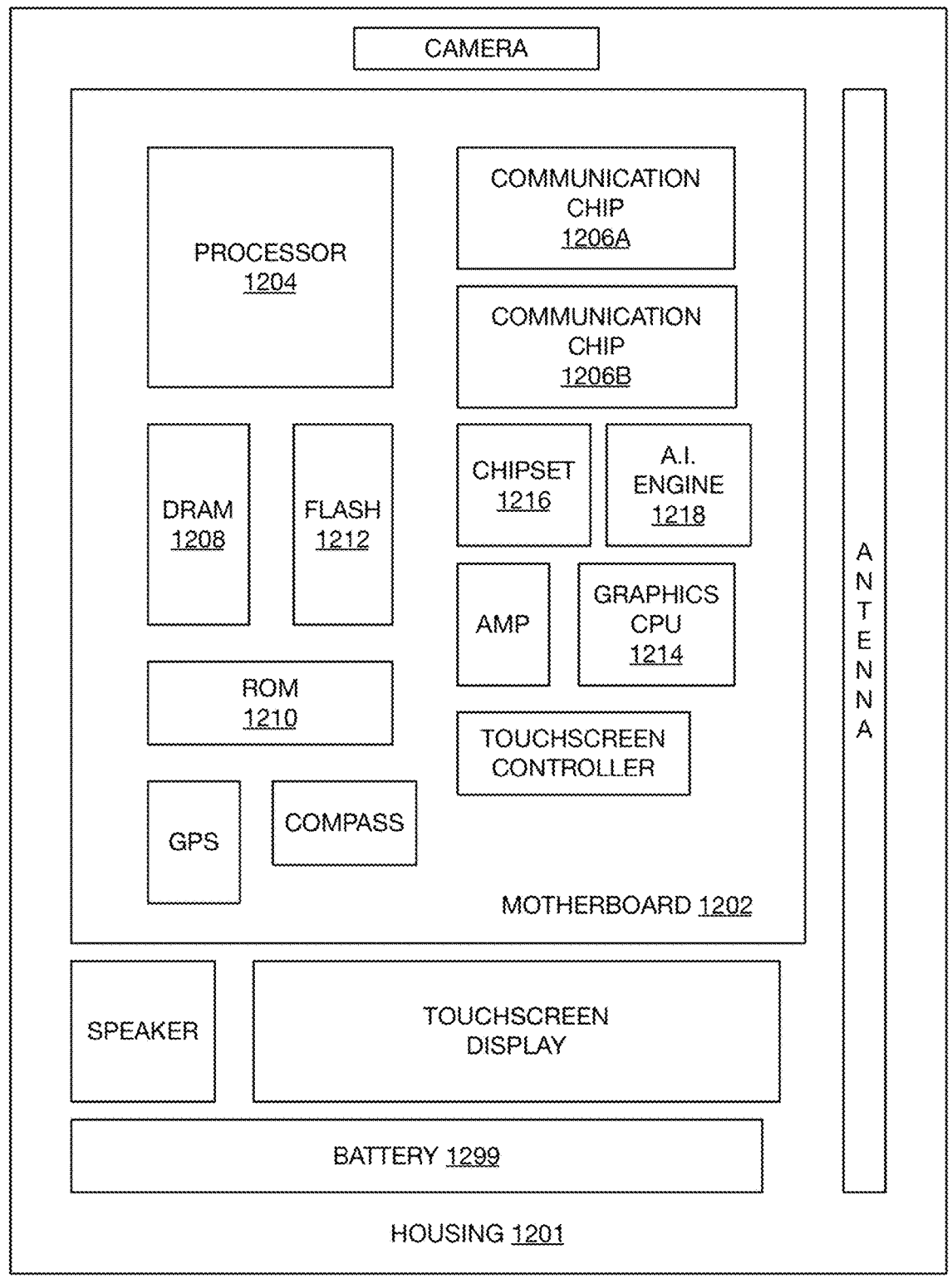
FIG. 12 illustrates an electronic system, specifically a computing device, all arranged in accordance with at least some implementations of the present disclosure.

FIG. 12 illustrates an electronic system, specifically a computing device 1200, in accordance with at least some implementations of the present disclosure. Computing device 1200 may include a housing 1201 having a board 1202 disposed therein. Computing device 1200 may include a number of integrated circuit components, including but not limited to a processor 1204, at least one communication chip 1206A, 1206B (including Network Devices or Processors), volatile memory 1208 (e.g., DRAM), non-volatile memory 1210 (e.g., ROM), flash memory 1212, a graphics processor or CPU 1214, a digital signal processor (not shown), a crypto processor (not shown), a chipset 1216, an Artificial Intelligence (A.I.) Engine 1218, an antenna, a display (touchscreen display), a touchscreen controller, a battery 1299 (or other power supply), an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to board 1202. In some implementations, at least one of the integrated circuit components may be a part of processor 1204.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

The entire computing device 1200 or at least one of the integrated circuit dies within computing device 1200 may use a thermoresponsive material within a via or trench. In some embodiments, the integrated circuit die includes a via containing thermoresponsive material. In some embodiments, the integrated circuit die includes a via and a trench containing thermoresponsive material. In some embodiments, two or more integrated circuit dies are stacked, each with a via containing thermoresponsive material, and their vias are aligned with and thermally coupled to each other.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-12. The subject matter may be applied to other integrated circuit devices and assembly applications, as well as any appropriate electronic application, as will be understood to those skilled in the art.

The following examples pertain to further embodiments, and specifics in the examples may be used anywhere in one or more embodiments.

In one or more first embodiments, an integrated circuit die comprises a device layer adjacent to a first surface of the integrated circuit die, a plurality of metal interconnect layers above the device layer and adjacent to a second surface of the integrated circuit die, opposite the first surface, and thermoresponsive material within a via extending vertically through at least a portion of the device layer and one or more of the metal interconnect layers.

In one or more second embodiments, further to the first embodiments, a trench is laterally adjacent one or more of the metal interconnect layers, the trench comprising a second width greater than a first width of the first via, wherein the thermoresponsive material is within the trench.

In one or more third embodiments, further to the first or second embodiments, the thermoresponsive material comprises lithium nitrate trihydrate.

In one or more fourth embodiments, further to the first through third embodiments, thermoresponsive material is within a second via extending vertically through the device layer and one or more of the metal interconnect layers.

In one or more fifth embodiments, further to the first through fourth embodiments, a second thermoresponsive material is within a trench extending through one or more of the metal interconnect layers and thermally coupled to the first and second vias and with the second surface of the integrated circuit die, the trench having a second width greater than a first width of the first via.

In one or more sixth embodiments, further to the first through fifth embodiments, the first and second vias extend vertically to the second surface of the integrated circuit die.

In one or more seventh embodiments, further to the first through sixth embodiments, a second integrated circuit die with features like those of the first integrated circuit die is coupled to the first integrated circuit die with at least the vias of the first and second integrated circuit dies aligned.

In one or more eighth embodiments, a system comprises a first integrated circuit die having a first surface, an opposing second surface, and a first thermoresponsive material within a first via extending from the first surface at least partially through the first integrated circuit die, and a second integrated circuit die having a third surface, an opposing fourth surface, and a second thermoresponsive material within a second via extending into the second integrated circuit die from the first surface, wherein the first and second integrated circuit dies are coupled with the second surface of the first integrated circuit die coupled to the third surface of the second integrated circuit die and with the first via and the second via substantially coaxially aligned.

In one or more ninth embodiments, further to the eighth embodiments, the first thermoresponsive material within the via of the first integrated circuit die is in fluid communication with the second thermoresponsive material within the via of the second integrated circuit die.

In one or more tenth embodiments, further to the eighth or ninth embodiments, the via of the first integrated circuit die and the via of the second integrated circuit die are terminated by metal pads substantially planar with, respectively, the second surface of the first integrated circuit die and the first surface of the second integrated circuit die, the vias being thermally coupled by the metal pads.

In one or more eleventh embodiments, further to the eighth through tenth embodiments, a third thermoresponsive material is within a trench extending into the second integrated circuit die from the second surface of the second integrated circuit die, the trench having a second width wider than a first width of the via of the second integrated circuit die.

In one or more twelfth embodiments, further to the eighth through eleventh embodiments, the third thermoresponsive material comprises lithium nitrate trihydrate.

In one or more thirteenth embodiments, further to the eighth through twelfth embodiments, a heat spreader thermally couples to the trench at the second surface of the second integrated circuit die.

In one or more fourteenth embodiments, further to the eighth through thirteenth embodiments, the first and second thermoresponsive materials comprise the same thermoresponsive material composition.

In one or more fifteenth embodiments, a method comprises receiving a first integrated circuit die having a first surface and an opposing second surface, forming a vertical hole into the first integrated circuit die from the first surface, and introducing a thermoresponsive material into the vertical hole.

In one or more sixteenth embodiments, further to the fifteenth embodiments, the vertical hole extends through the first integrated circuit die to the second surface and terminates at a metal pad substantially planar with the second surface of the first integrated circuit die.

In one or more seventeenth embodiments, further to the fifteenth or sixteenth embodiments, a method comprises forming a trench in the second surface of the first integrated circuit die, forming a first layer within the trench, introducing a second thermoresponsive material into the trench onto the first layer within the trench, and forming a second layer over the second thermoresponsive material.

In one or more eighteenth embodiments, further to the fifteenth through seventeenth embodiments, a method comprises receiving a second integrated circuit die having a first surface, an opposing second surface, and a first thermoresponsive material within a vertical hole of the second integrated circuit die, and coupling the second surface of the first integrated circuit die to the first surface of the second integrated circuit die or coupling the first surface of the first integrated circuit die to the second surface of the second integrated circuit, wherein the second thermoresponsive material in the trench of the first integrated circuit die is thermally coupled to the first thermoresponsive material in the vertical hole of the second integrated circuit die.

In one or more nineteenth embodiments, further to the fifteenth through eighteenth embodiments, a method comprises receiving a second integrated circuit die having a first surface, an opposing second surface, and a vertical hole configured to contain a second thermoresponsive material, and coupling the second surface of the first integrated circuit die to the first surface of the second integrated circuit die, wherein the vertical hole of the first integrated circuit die extends through to the second surface of the first integrated circuit die and is substantially coaxially aligned with the vertical hole of the second integrated circuit die.

In one or more twentieth embodiments, further to the fifteenth through nineteenth embodiments, the vertical hole of the first integrated circuit die is in fluid communication with the vertical hole of the second integrated circuit die, and the introducing the first thermoresponsive material into the vertical hole of the first integrated circuit die introduces the first thermoresponsive material into the vertical hole of the second integrated circuit die.

In one or more twenty-first embodiments, further to the fifteenth through twentieth embodiments, the vertical holes of the first and second integrated circuit dies terminate at their coupling with metal pads, the metal pads of the first and second integrated circuit dies being substantially planar with the second surface of the first integrated circuit die and the first surface of the second integrated circuit die respectively.

In one or more twenty-second embodiments, further to the fifteenth through twenty-first embodiments, a method comprises forming, prior to introducing the thermoresponsive material into the vertical hole, a layer on a surface of the vertical hole.

Having thus described in detail embodiments of the present invention, it is understood that the invention defined by the appended claims is not to be limited by particular details set forth in the above description, as many apparent variations thereof are possible without departing from the spirit or scope thereof.

We claim:

1. An integrated circuit die, comprising:
   a device layer adjacent to a first surface of the integrated circuit die;
   a plurality of metal interconnect layers above the device layer and adjacent to a second surface of the integrated circuit die, opposite the first surface; and
   thermoresponsive material within a via extending vertically through at least a portion of the device layer and one or more of the metal interconnect layers.

2. The integrated circuit die of claim 1, further comprising:
   a trench laterally adjacent one or more of the metal interconnect layers, the trench comprising a second width greater than a first width of the via, wherein the thermoresponsive material is within the trench.

3. The integrated circuit die of claim 1, wherein the thermoresponsive material comprises lithium, nitrogen, oxygen, and hydrogen.

4. The integrated circuit die of claim 1, wherein the via is a first via, further comprising:
   the thermoresponsive material within a second via extending vertically through the device layer and one or more of the metal interconnect layers.

5. The integrated circuit die of claim 4, wherein the thermoresponsive material is a first thermoresponsive material, further comprising:
   a second thermoresponsive material within a trench extending through one or more of the metal interconnect layers and thermally coupling to the first and second vias and with the second surface of the integrated circuit die, the trench having a second width greater than a first width of the first via.

6. The integrated circuit die of claim 4, wherein the first and second vias extend vertically to the second surface of the integrated circuit die.

7. A system, comprising:
   a first integrated circuit die having a first surface, an opposing second surface, and a first thermoresponsive material within a first via extending from the first surface at least partially through the first integrated circuit die; and
   a second integrated circuit die having a third surface, an opposing fourth surface, and a second thermoresponsive material within a second via extending into the second integrated circuit die from the third surface, wherein the first and second integrated circuit dies are coupled with the second surface of the first integrated circuit die coupled to the third surface of the second integrated circuit die and with the first via and the second via substantially coaxially aligned.

8. The system of claim 7, wherein the first thermoresponsive material within the first via of the first integrated circuit die is in fluid communication with the second thermoresponsive material within the second via of the second integrated circuit die.

9. The system of claim 7, wherein the first via of the first integrated circuit die and the second via of the second integrated circuit die are terminated by metal pads substantially planar with, respectively, the second surface of the first integrated circuit die and the third surface of the second integrated circuit die, the first and second vias being thermally coupled by the metal pads.

10. The system of claim 7, further comprising:
    a third thermoresponsive material within a trench extending into the second integrated circuit die from the fourth surface of the second integrated circuit die, the trench having a second width wider than a first width of the second via of the second integrated circuit die.

11. The system of claim 10, wherein the third thermoresponsive material comprises lithium, nitrogen, oxygen, and hydrogen.

12. The system of claim 10, further comprising:
    a heat spreader thermally coupled to the trench at the fourth surface of the second integrated circuit die.

13. The system of claim 7, wherein the first and second thermoresponsive materials comprise the same thermoresponsive material composition.

14. A method, comprising:
    receiving an integrated circuit die having a first surface, an opposing second surface, and a device layer between the first and second surfaces;
    forming a vertical hole into the integrated circuit die from the first surface and through the device layer; and
    introducing a thermoresponsive material into the vertical hole.

15. The method of claim 14, wherein the vertical hole extends through the integrated circuit die to the second surface and terminates at a metal pad substantially planar with the second surface of the integrated circuit die.

16. The method of claim 14, wherein the thermoresponsive material is a first thermoresponsive material, further comprising:
    forming a trench in the second surface of the integrated circuit die;
    forming a first layer within the trench;
    introducing a second thermoresponsive material into the trench onto the first layer within the trench; and
    forming a second layer over the second thermoresponsive material.

17. The method of claim 16, wherein the integrated circuit die is a first integrated circuit die and the vertical hole is a first vertical hole, further comprising:
    receiving a second integrated circuit die having a third surface, an opposing fourth surface, and a third thermoresponsive material within a second vertical hole of the second integrated circuit die; and
    coupling the second surface of the first integrated circuit die to the third surface of the second integrated circuit die or coupling the first surface of the first integrated circuit die to the fourth surface of the second integrated circuit, wherein the second thermoresponsive material in the trench of the first integrated circuit die is thermally coupled to the third thermoresponsive material in the vertical hole of the second integrated circuit die.

18. The method of claim 14, wherein the integrated circuit die is a first integrated circuit die, the vertical hole is a first vertical hole, and the thermoresponsive material is a first thermoresponsive material, further comprising:

receiving a second integrated circuit die having a third surface, an opposing fourth surface, and a second vertical hole configured to contain a second thermoresponsive material; and coupling the second surface of the first integrated circuit die to the third surface of the second integrated circuit die, wherein the first vertical hole of the first integrated circuit die extends through to the second surface of the first integrated circuit die and is substantially coaxially aligned with the second vertical hole of the second integrated circuit die.

19. The method of claim 18, wherein the first vertical hole of the first integrated circuit die is in fluid communication with the second vertical hole of the second integrated circuit die, and the introducing the first thermoresponsive material into the first vertical hole of the first integrated circuit die introduces the first thermoresponsive material into the second vertical hole of the second integrated circuit die.

20. The method of claim 18, wherein the first and second vertical holes terminate at their coupling with first and second metal pads, the first and second metal pads substantially planar with the second surface of the first integrated circuit die and the first surface of the second integrated circuit die, respectively.

21. The method of claim 14, further comprising:

forming, prior to introducing the thermoresponsive material into the vertical hole, a layer on a surface of the vertical hole.

\* \* \* \* \*